(12) United States Patent
Shin et al.

(10) Patent No.: US 11,114,463 B2
(45) Date of Patent: Sep. 7, 2021

(54) SEMICONDUCTOR DEVICE

(71) Applicant: SAMSUNG ELECTRONICS CO., LTD., Suwon-si (KR)

(72) Inventors: Seung Jun Shin, Yongin-si (KR); Hyun Mog Park, Seoul (KR); Joong Shik Shin, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 6 days.

(21) Appl. No.: 16/892,384

(22) Filed: Jun. 4, 2020

(65) Prior Publication Data

US 2020/0303413 A1    Sep. 24, 2020

Related U.S. Application Data

(63) Continuation of application No. 15/933,544, filed on Mar. 23, 2018, now Pat. No. 10,680,007.

(30) Foreign Application Priority Data

Jul. 18, 2017    (KR) .................. 10-2017-0090804

(51) Int. Cl.
   *H01L 27/11582*    (2017.01)
   *H01L 27/11575*    (2017.01)
   (Continued)

(52) U.S. Cl.
   CPC .... *H01L 27/11582* (2013.01); *H01L 21/3213* (2013.01); *H01L 21/76802* (2013.01);
   (Continued)

(58) Field of Classification Search
   None
   See application file for complete search history.

(56) References Cited

U.S. PATENT DOCUMENTS

| 9,190,514 B2 | 11/2015 | Lee et al. |
| 9,306,040 B2 | 4/2016 | Choi et al. |

(Continued)

FOREIGN PATENT DOCUMENTS

| CN | 106920794 A | 7/2017 |
| KR | 10-2015-0116995 A | 10/2015 |
| KR | 10-2015-0140067 A | 12/2015 |

OTHER PUBLICATIONS

Search Report and Written Opinion, dated Dec. 20, 2018, by the Singapore Intellectual Property Office for corresponding application SG 10201805477Y.
Indian Office action dated Nov. 21, 2019 for corresponding application in 201814025669.

*Primary Examiner* — Nicholas J Tobergte
*Assistant Examiner* — Kien C Ly
(74) *Attorney, Agent, or Firm* — Lee IP Law, P.C.

(57) ABSTRACT

A semiconductor device includes gate electrodes stacked along a direction perpendicular to an upper surface of a substrate, the gate electrodes extending to different lengths in a first direction, and each gate electrode including subgate electrodes spaced apart from each other in a second direction perpendicular to the first direction, and gate connection portions connecting subgate electrodes of a same gate electrode of the gate electrodes to each other, channels extending through the gate electrodes perpendicularly to the upper surface of the substrate, and dummy channels extending through the gate electrodes perpendicularly to the upper surface of the substrate, the dummy channels including first dummy channels arranged in rows and columns, and second dummy channels arranged between the first dummy channels in a region including the gate connection portions.

19 Claims, 30 Drawing Sheets

(51) Int. Cl.
  *H01L 27/11565* (2017.01)
  *H01L 27/11526* (2017.01)
  *H01L 27/11573* (2017.01)
  *H01L 27/11556* (2017.01)
  *H01L 21/3213* (2006.01)
  *H01L 29/792* (2006.01)
  *H01L 29/78* (2006.01)
  *H01L 29/66* (2006.01)
  *H01L 29/417* (2006.01)
  *H01L 21/768* (2006.01)
  *H01L 29/788* (2006.01)
  *H01L 27/1157* (2017.01)

(52) U.S. Cl.
  CPC .... *H01L 21/76877* (2013.01); *H01L 27/1157* (2013.01); *H01L 27/11526* (2013.01); *H01L 27/11556* (2013.01); *H01L 27/11565* (2013.01); *H01L 27/11573* (2013.01); *H01L 27/11575* (2013.01); *H01L 29/41775* (2013.01); *H01L 29/66666* (2013.01); *H01L 29/7827* (2013.01); *H01L 29/7889* (2013.01); *H01L 29/7926* (2013.01)

(56) References Cited

U.S. PATENT DOCUMENTS

| | | | |
|---|---|---|---|
| 9,306,041 | B2 | 4/2016 | Hwang et al. |
| 9,425,205 | B2 | 8/2016 | Shimura |
| 9,425,208 | B2 | 8/2016 | Kim et al. |
| 9,716,104 | B2 | 7/2017 | Kim et al. |
| 10,026,746 | B2 | 7/2018 | Lee et al. |
| 10,312,191 | B2 | 6/2019 | Jung et al. |
| 2014/0199815 | A1 | 7/2014 | Hwang et al. |
| 2015/0137216 | A1 | 5/2015 | Lee et al. |
| 2015/0318301 | A1 | 11/2015 | Lee et al. |
| 2015/0372101 | A1* | 12/2015 | Lee ............... H01L 29/7827 257/314 |
| 2016/0079254 | A1 | 3/2016 | Shimura |
| 2016/0225785 | A1 | 8/2016 | Kim et al. |
| 2017/0047339 | A1 | 2/2017 | Cernea |
| 2017/0098658 | A1* | 4/2017 | Matsuda ......... H01L 27/11565 |
| 2017/0200676 | A1 | 7/2017 | Jeong et al. |
| 2018/0261618 | A1 | 9/2018 | Lee et al. |
| 2019/0019807 | A1 | 1/2019 | Gu et al. |
| 2019/0027490 | A1 | 1/2019 | Shin et al. |
| 2019/0043880 | A1 | 2/2019 | Lee et al. |

* cited by examiner

SEMICONDUCTOR DEVICE

CROSS-REFERENCE TO RELATED APPLICATIONS

This is a continuation application based on pending application Ser. No. 15/933,544, filed Mar. 23, 2018, the entire contents of which is hereby incorporated by reference.

Korean Patent Application No. 10-2017-0090804 filed on Jul. 18, 2017 in the Korean Intellectual Property Office, and entitled: "Semiconductor Device," is incorporated by reference herein in its entirety.

BACKGROUND

1. Field

Embodiments relate to a semiconductor device.

2. Description of the Related Art

Semiconductor devices are required to process large amounts of data while volumes thereof are decreasing. Therefore, it is necessary to increase a degree of integration of the semiconductor elements forming such a semiconductor device. Accordingly, as a method of improving a degree of integration of a semiconductor device, a semiconductor device having a vertical transistor structure, instead of a planar transistor structure, has been proposed.

SUMMARY

According to an aspect of embodiments, a semiconductor device may include gate electrodes stacked along a direction perpendicular to an upper surface of a substrate, the gate electrodes extending to different lengths in a first direction, and each gate electrode including subgate electrodes spaced apart from each other in a second direction perpendicular to the first direction, and gate connection portions connecting subgate electrodes of a same gate electrode of the gate electrodes to each other, channels extending through the gate electrodes perpendicularly to the upper surface of the substrate, and dummy channels extending through the gate electrodes perpendicularly to the upper surface of the substrate, the dummy channels including first dummy channels arranged in rows and columns, and second dummy channels arranged between the first dummy channels in a region including the gate connection portions.

According to another aspect of embodiments, a semiconductor device may include gate electrodes including subgate electrodes spaced apart from each other to be perpendicular to an upper surface of a substrate and stacked, and gate connection portions connecting a portion of the subgate electrodes to each other in the same layer, channels extended to be perpendicular to the substrate while passing through the gate electrodes, and dummy channels extended to be perpendicular to the substrate while passing through the gate connection portions or the subgate electrodes near the gate connection portions.

According to yet another aspect of embodiments, a semiconductor device may include a substrate having a first region and a second region, gate electrodes spaced apart from each other in a first direction, perpendicular to an upper surface of the substrate and stacked in the first region, and extended by different lengths in a second direction, perpendicular to the first direction in the second region, first isolation regions extended in the second direction while passing through the gate electrodes, and disposed to be spaced apart from each other in a third direction, perpendicular to the first direction and the second direction, in the first region and the second region, a plurality of second isolation regions passing through the gate electrodes between the first isolation regions, and disposed to be spaced apart from each other in the second direction, channels extended to be perpendicular to the substrate while passing through the gate electrodes in the first region, and dummy channels extended to be perpendicular to the substrate while passing through the gate electrodes, and including first dummy channels arranged in rows and columns and second dummy channels disposed to be adjacent to a region in which the second isolation regions are spaced apart from each other.

BRIEF DESCRIPTION OF DRAWINGS

Features will become apparent to those of skill in the art by describing in detail exemplary embodiments with reference to the attached drawings, in which.

DETAILED DESCRIPTION

Embodiments will now be described in detail with reference to the accompanying drawings.

Figure 1:
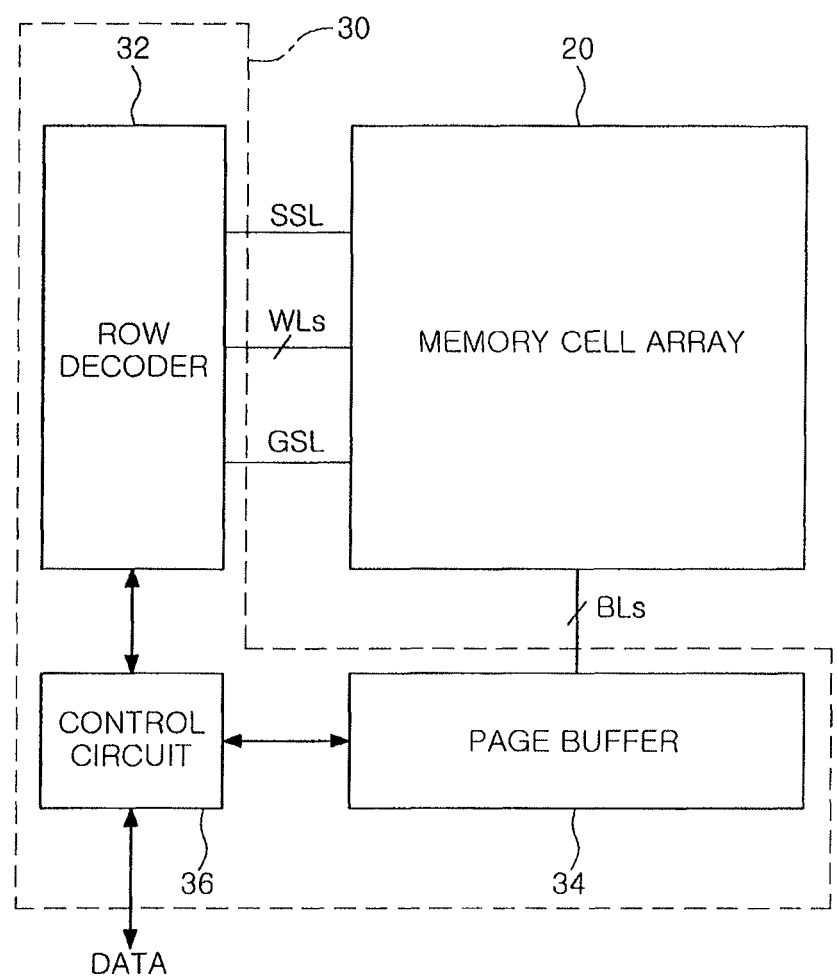
FIG. 1 illustrates a schematic block diagram of a semiconductor device according to example embodiments.

FIG. 1 is a schematic block diagram of a semiconductor device according to example embodiments.

Referring to FIG. 1, a semiconductor device 10 may include a memory cell array 20 and a control logic 30.

The memory cell array 20 may include a plurality of memory blocks, and each of the memory blocks may include a plurality of memory cells. The plurality of memory cells may be connected to a row decoder 32 through a string select line SSL, a plurality of word lines WLs, and a ground select line GSL, and may be connected to a page buffer 34 through a plurality of bit lines BLs. In example embodiments, a plurality of memory cells arranged in the same row may be connected to the same word line WL, and a plurality of memory cells arranged in the same column may be connected to the same bit line BL.

The control logic 30 may include the row decoder 32, the page buffer 34, and a control circuit 36.

The row decoder 32 may decode an input address to generate and transmit driving signals of the word line WL. The row decoder 32 may provide a word line voltage generated from a voltage generating circuit in the control circuit 36 to each of a word line WL, having been selected, and word lines WLs, having not been selected, in response to the control of the control circuit 36.

The page buffer 34 may be connected to the memory cell array 20 through the bit lines BLs to read information stored in the memory cells. The page buffer 34 may temporarily store data to be stored in the memory cells or sense data stored in the memory cells according to an operation mode. The page buffer 34 may include a column decoder and a sense amplifier. The column decoder may selectively activate the bit lines BLs of the memory cell array 20, and the sense amplifier may sense a voltage of a bit line BL, having been selected by the column decoder, to read data stored in a memory cell, having been selected, during a reading operation.

The control circuit 36 may control operations of the row decoder 32 and the page buffer 34. The control circuit 36 may receive a control signal and an external voltage transmitted from an external source, and may be operated according to the control signal having been received. The control circuit 36 may include a voltage generating circuit generating a voltage required for internal operations, e.g., a program voltage, a reading voltage, an erasing voltage, or the like, using an external voltage. The control circuit 36 may control reading, writing, and/or erasing operations in response to the control signals. The control circuit 36 may include an input and output circuit. The input and output circuit may receive data DATA to transfer the data to the page buffer 34 in a program operation, and may output the data DATA received from the page buffer 34 in a reading operation.

Figure 2:
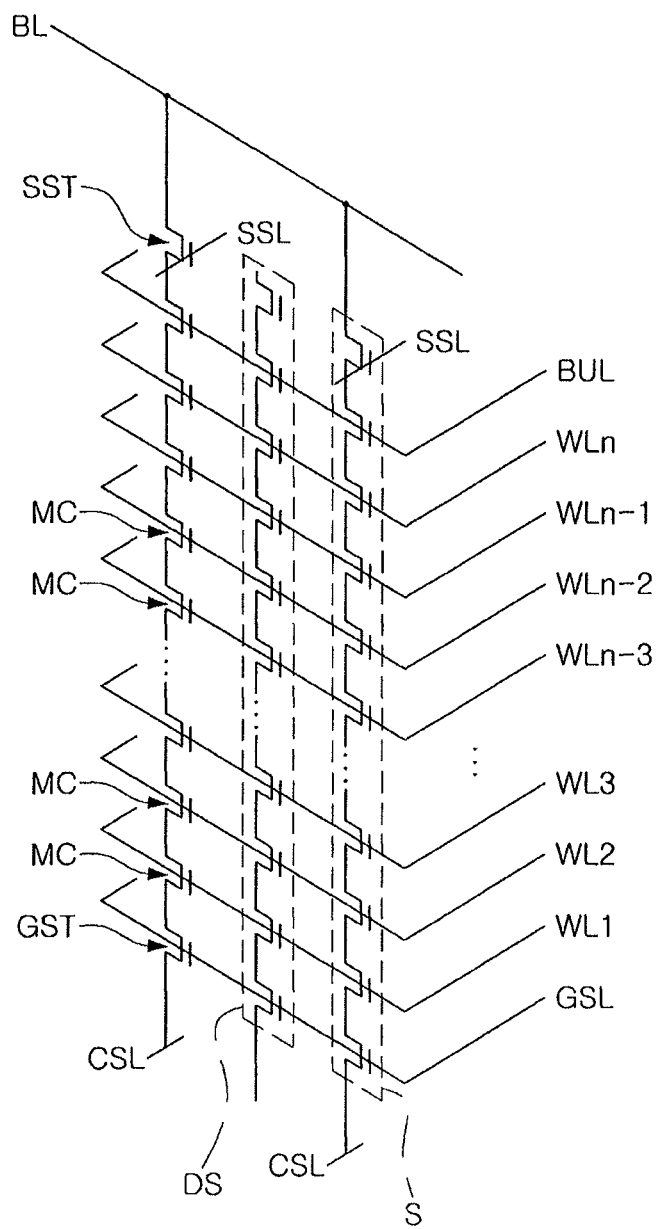
FIG. 2 illustrates an equivalent circuit diagram of a memory cell array of a semiconductor device according to example embodiments.

FIG. 2 is an equivalent circuit diagram of a memory cell array of a semiconductor device according to example embodiments. FIG. 2 is a conceptual circuit diagram illustrating the memory cell array 20 of FIG. 1.

Referring to FIG. 2, the memory cell array 20 may include a plurality of memory cell strings S including memory cells MC connected in series to each other, as well as a ground selection transistor GST and a string select transistor SST connected in series at both ends of the memory cells MC. The memory cells MC, connected in series to each other, may be connected to n number of word lines WL1 to WLn for selection of the memory cells MC, respectively.

A gate terminal of the ground selection transistor GST may be connected to the ground select line GSL, and a source terminal may be connected to the common source line CSL. A gate terminal of the string select transistor SST may be connected to the string select line SSL, and a source terminal may be connected to a drain terminal of the memory cells MC. In FIG. 2, a structure, in which a single ground selection transistor GST and a single string select transistor SST are connected to each of a plurality of memory cells MC, connected in series to each other, is illustrated. Alternatively, a plurality of ground selection transistors GST or a plurality of string select transistors SST may be connected thereto. In example embodiments, one or more dummy lines or buffer lines BUL may be further disposed between an uppermost word line WLn among the word lines WL1 to WLn and the string select line SSL.

A drain terminal of the string select transistor SST may be connected to the bit line BL. When a signal is applied through the string select line SSL to the gate terminal of the string select transistor SST, a signal, applied through the bit line BL, is transmitted to the memory cells MC, connected in series to each other, so data reading and writing operations may be performed. An erasing voltage is applied through the substrate, so an erasing operation for erasing data written in the memory cells MC may be performed.

A semiconductor element according to an example embodiment may include at least one dummy string DS. The dummy string DS may be a string including a dummy channel electrically isolated from the bit line BL.

Figure 3:
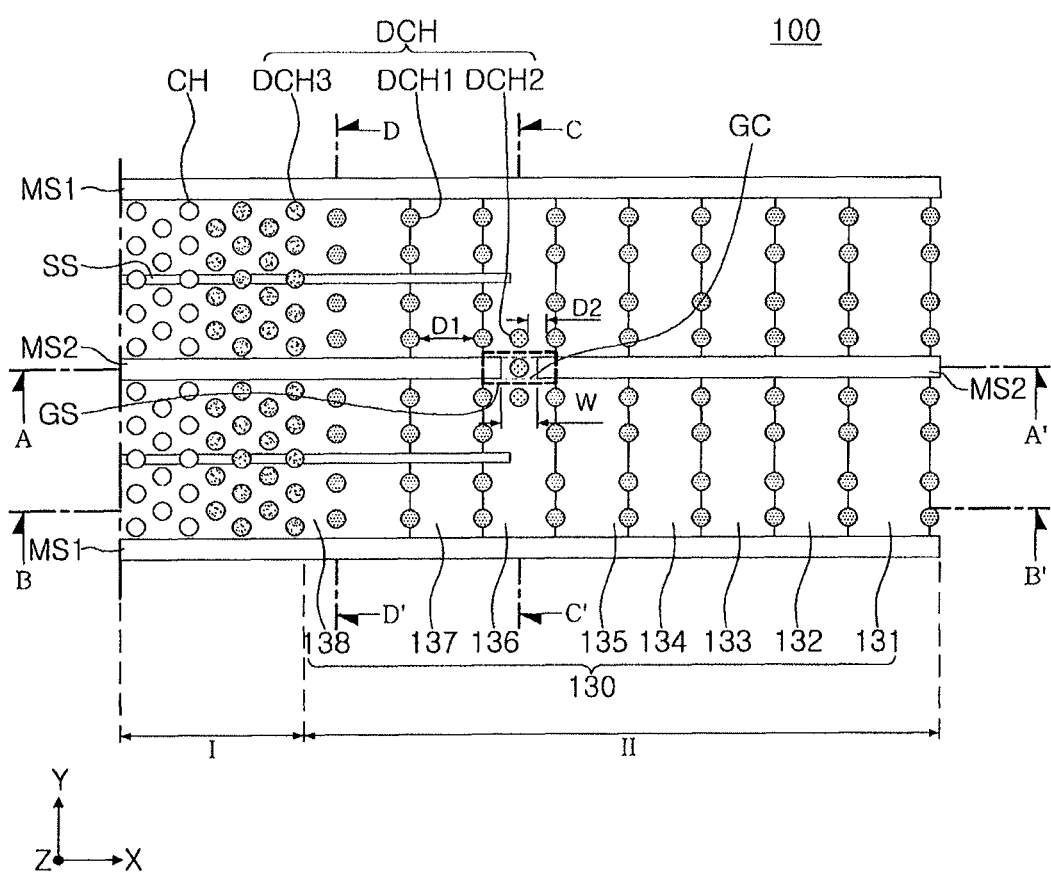
FIG. 3 illustrates a schematic plan view of a semiconductor device according to example embodiments.

FIG. 3 is a schematic plan view of a semiconductor device according to example embodiments. In FIG. 3, only a main configuration of a semiconductor device 100 is illustrated for the sake of understanding. FIGS. 4A through 4D are schematic cross-sectional views of a semiconductor device according to example embodiments. In FIGS. 4A through 4D, cross sections taken along lines A-A', B-B', C-C', and D-D' of FIG. 3, respectively, are illustrated.

Figure 4A:
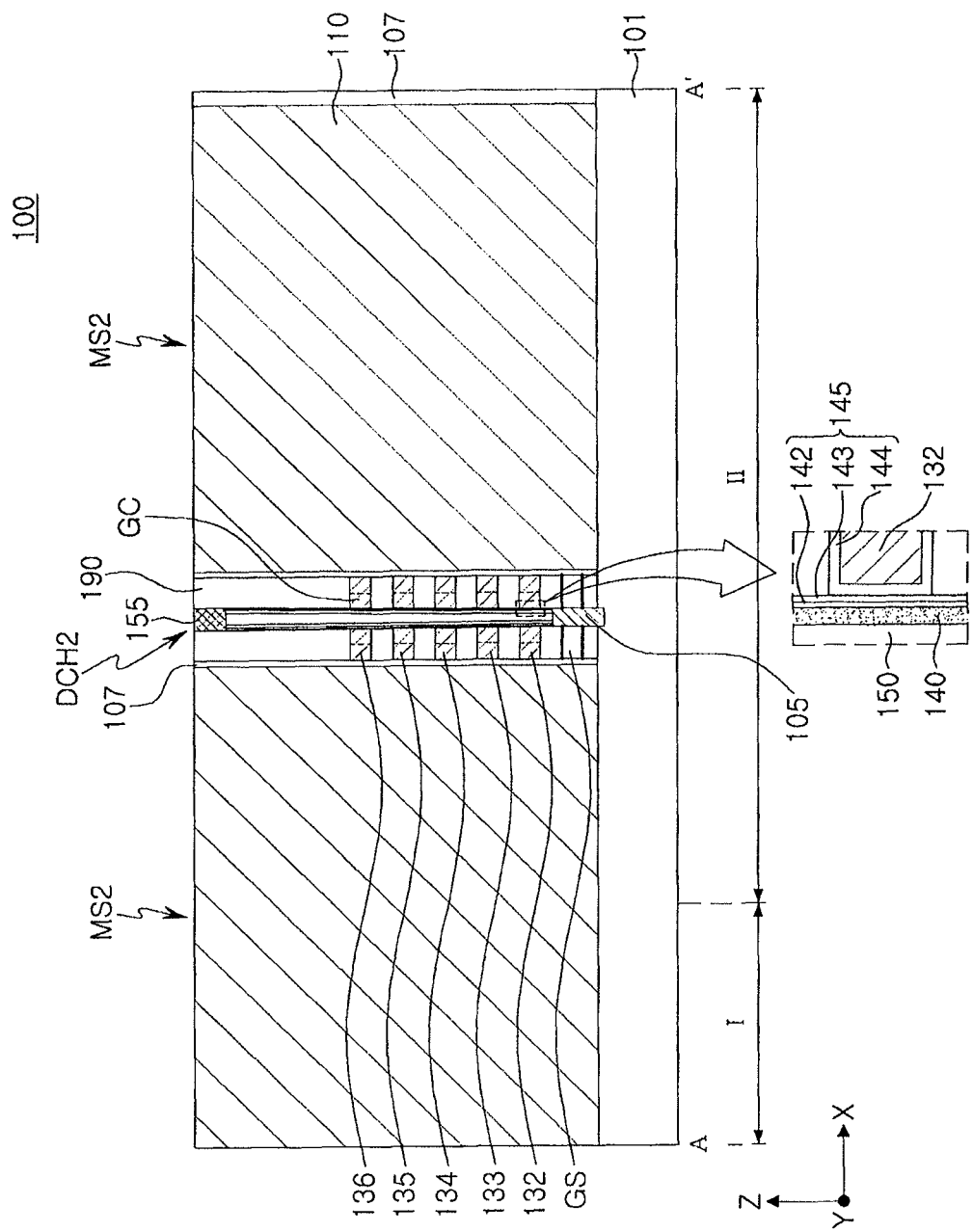
FIGS. 4A through 4D illustrate schematic cross-sectional views of a semiconductor device according to example embodiments.
Figure 4B:
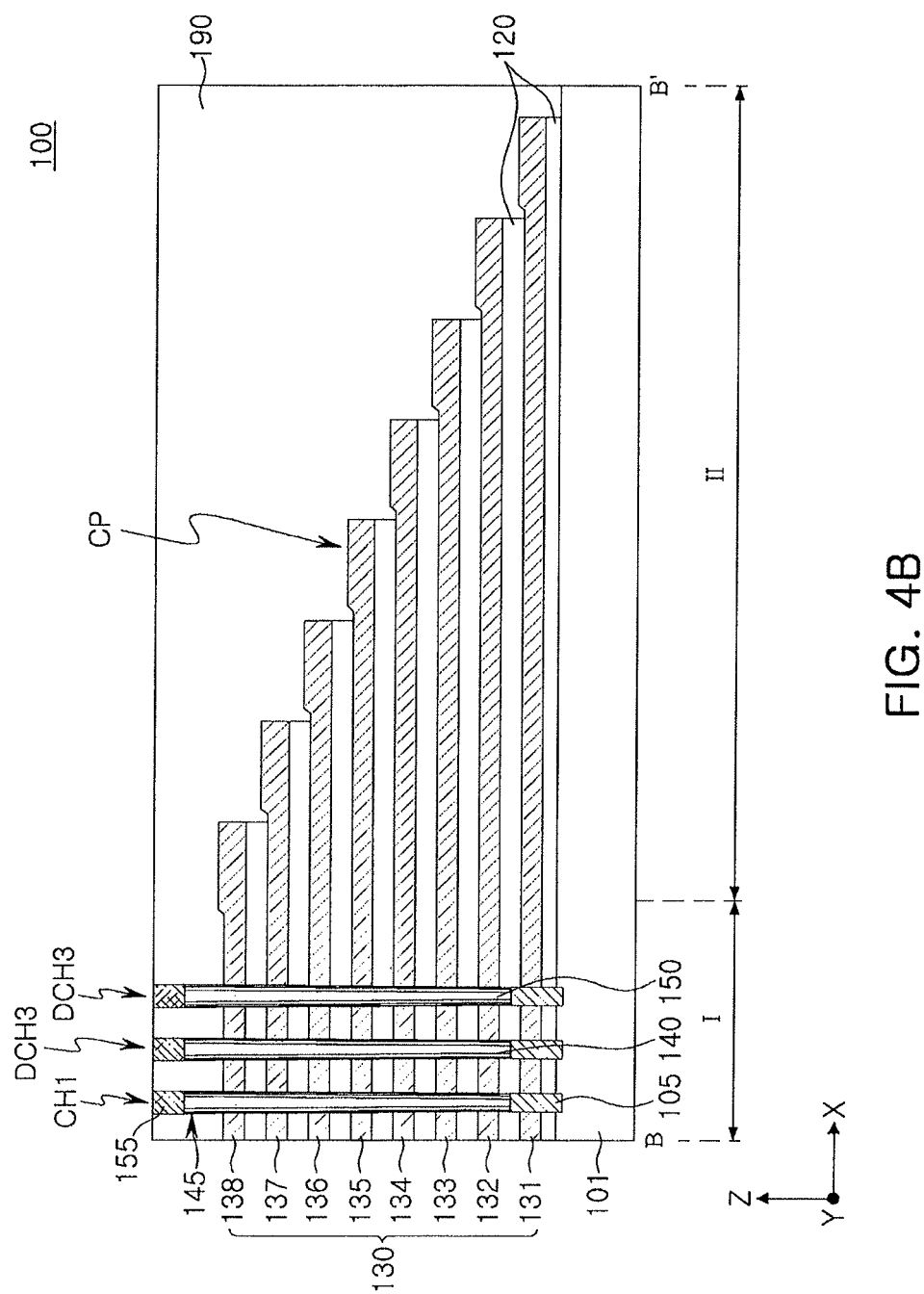
Figure 4C:
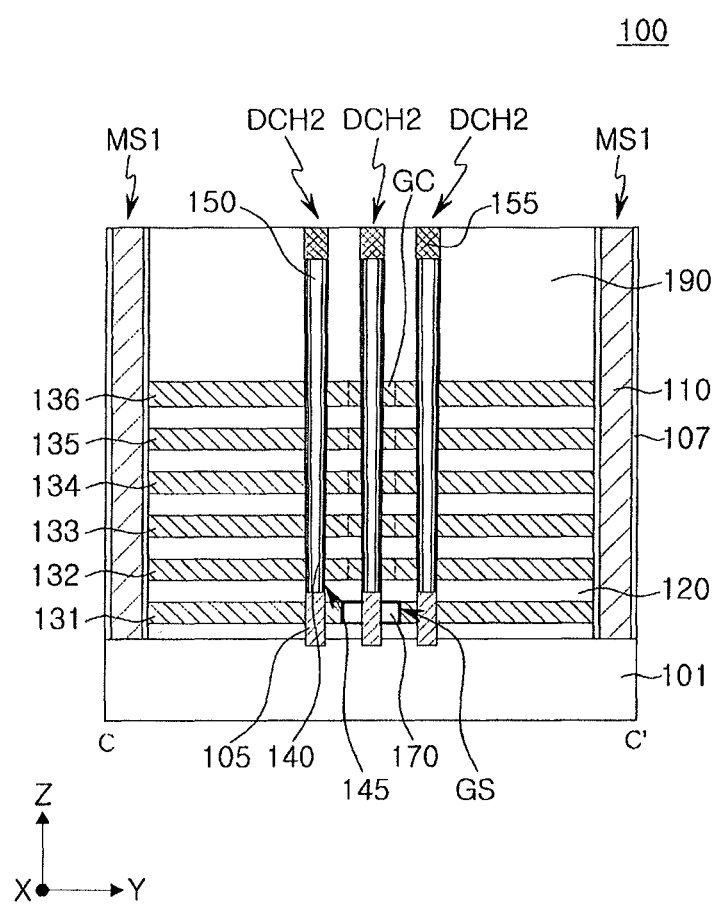
Figure 4D:
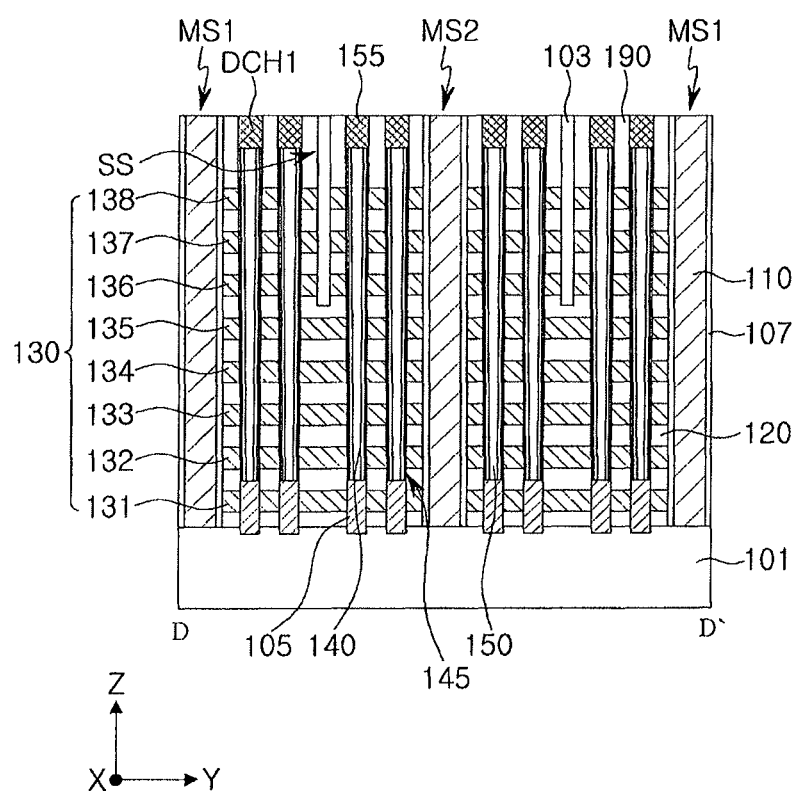

Referring to FIGS. 3 through 4D, the semiconductor device 100 may include a substrate 101 having a first region I and a second region II, gate electrodes 130 (e.g., first through eighth gate electrodes 131 to 138) stacked on the substrate 101, channels CH and dummy channels DCH disposed to pass through the gate electrodes 130, a first isolation region MS1 and a second isolation region MS2, extended while passing through the gate electrodes 130, upper isolation regions SS passing through a portion of the gate electrodes 130, and a lower isolation region GS passing through one of the gate electrodes 130. The semiconductor device 100 may further include interlayer insulating layers 120 alternately stacked with the gate electrodes 130 on the substrate 101, a gate dielectric layer 145, a channel region 140, a channel pad 155, and a channel insulating layer 150 in the channels CH, as well as a peripheral region insulating layer 190.

The first region I of the substrate 101 may be a region corresponding to the memory cell array 20 of FIG. 1, and the second region II may correspond to a region electrically connecting the memory cell array 20 and the control logic 30 of FIG. 1. The second region II may be disposed in at least one end of the first region I, in at least one direction, e.g., in an x-direction.

The substrate 101 may have an upper surface extended in the x-direction and a y-direction. The substrate 101 may include a semiconductor material, e.g., a Group IV semiconductor, a Group III-V compound semiconductor, or a Group II-VI oxide semiconductor. For example, the Group IV semiconductor may include silicon, germanium or silicon-germanium. The substrate 101 may be provided as a bulk wafer or an epitaxial layer.

The gate electrodes 130 are spaced apart from each other to be perpendicular to the first region I and stacked, e.g., the gate electrodes 130 may be stacked above each other along a direction perpendicular to the top surface of the first region I, and may be extended by different lengths from the first region I to the second region II. Each of the gate electrodes 130 may form a gate of each of the ground selection transistor GST, the plurality of memory cells MC, and the string select transistor SST of FIG. 2. According to the capacity of the semiconductor device 100, the number of the gate electrodes 130 forming the memory cells MC may be determined. According to example embodiments, a gate electrode 130 of each of the string select transistor SST and the ground selection transistor GST may be provided as one gate electrode or two or more gate electrodes, and may have a structure the same as or different from the gate electrodes 130 of the memory cells MC. A portion of the gate electrodes 130, e.g., gate electrodes 130 adjacent to the gate electrodes 130 of the ground selection transistor GST or the string select transistor SST, may be a dummy gate electrode.

As illustrated in FIG. 3, the gate electrodes 130 may be disposed separately from each other in the y-direction by a first isolation region MS1 extended in the x-direction, e.g., a portion of an exposed upper surface of each gate electrode 130 may extend in the y-direction and be at a different height than an upper exposed surface of an adjacent gate electrode 130 (e.g., so FIG. 3 illustrates exposed upper surfaces of each gate electrode between the dummy channels). The gate electrodes 130 between a pair of first isolation regions MS1 may form a single memory block, but a range of a memory block is not limited thereto. A portion among the gate electrodes 130, e.g., each of first through sixth gate electrodes 131 to 136, may include gate connection portions GC, and may be connected as a single layer in a single memory block thereby, which will be described in more detail below with reference to FIG. 5. A width W of the gate connection portions GC may be variously changed in example embodiments.

As illustrated in FIG. 4B, the gate electrodes 130 are extended by different lengths in the x-direction in the second region II of the substrate 101 to provide contact regions CP forming a stepped portion in the form of a staircase, e.g., the contact regions CP are in the exposed upper surfaces of the gate electrode 130 discussed previously. In the contact regions CP, the gate electrodes 130 may be connected to contact plugs, and the gate electrodes 130 may be connected to a wiring structure in an upper portion. In the contact regions CP, the gate electrodes 130 may have a form, in which a thickness is increased, so as to be stably connected to contact plugs.

The gate electrodes 130 may include a metal material, e.g., tungsten (W). In example embodiments, the gate electrodes 130 may include a polycrystalline silicon or metal silicide material. In example embodiments, the gate electrodes 130 may further include a diffusion barrier. For example, the diffusion barrier may include tungsten nitride (WN), tantalum nitride (TaN), titanium nitride (TiN), or combinations thereof.

The interlayer insulating layers 120 may be disposed between the gate electrodes 130. The interlayer insulating layers 120 may be disposed to be extended in the x-direction and to be spaced apart from each other in a direction perpendicular to an upper surface of the substrate 101, i.e., in a manner similar to the gate electrodes 130. The interlayer insulating layers 120 may include an insulating material, e.g., silicon oxide or silicon nitride.

The channels CH may be spaced apart from each other in rows and columns in the first region I. The channels CH may be arranged to form a lattice pattern or may be arranged in zigzag form in one direction. The channels CH may have a columnar shape (e.g., CH1 in FIG. 4B) and may have an inclined side surface, e.g., narrower toward the substrate 101 depending on an aspect ratio.

Referring to FIGS. 4A-4B, the channel region 140 may be disposed in the channels CH. The channel region 140 in the channels CH may be formed in an annular shape surrounding a channel insulating layer 150 located therein. However, according to example embodiments, the channel region may have a columnar shape, e.g., a cylinder or a prism, without the channel insulating layer 150. The channel region 140 may be connected to an epitaxial layer 105 in a lower portion. The channel region 140 may include a semiconductor material, e.g., polycrystalline silicon or single crystal silicon, and the semiconductor material may be an undoped material, or a material containing p-type or n-type impurities. The channels CH arranged in a straight line in the y-direction may be connected to bit lines BL (see FIGS. 1 and 2) different from each other, respectively, according to arrangement of an upper wiring structure connected to the channel pad 155.

Channel pads 155 may be disposed in an upper portion of the channel region 140 in the channels CH. The channel pads 155 may be disposed to cover an upper surface of the channel insulating layer 150 and to be electrically connected to the channel region 140. The channel pads 155 may include, e.g., doped polycrystalline silicon.

The gate dielectric layer 145 may be disposed between the gate electrodes 130 and the channel region 140. Referring to an enlarged view of FIG. 4A, the gate dielectric layer 145 may include a tunneling layer 142, a charge storage layer 143, and a blocking layer 144, sequentially stacked from the channel region 140. The tunneling layer 142 may tunnel a charge to the charge storage layer 143 by F—N tunneling mechanism. The tunneling layer 142 may include, e.g., silicon oxide ($SiO_2$), silicon nitride ($Si_3N_4$), silicon oxynitride (SiON), or combinations thereof. The charge storage layer 143 may be a charge trapping layer or a floating gate conductive layer. In example embodiments, when the charge storage layer 143 is a charge trapping layer, the charge storage layer 143 may be formed of silicon nitride. The blocking layer 144 may include, e.g., silicon oxide ($SiO_2$), silicon nitride ($Si_3N_4$), silicon oxynitride (SiON), a high dielectric constant (high-k) dielectric materials, or combinations thereof. In an example embodiment, the blocking layer 144 may be extended in a horizontal direction along the gate electrodes 130, but is not limited thereto. For example, at least a portion of the blocking layer 144 may be disposed to be vertically extended along the channel region 140 in the channels CH.

The epitaxial layer 105 may be disposed on the substrate 101 at a lower end of the channels CH, and may be disposed on a side surface of at least one gate electrode 130. The epitaxial layer 105 may be disposed in a recessed region of the substrate 101. A level of an upper surface of the epitaxial layer 105 may be higher than a level of an upper surface of the first gate electrode 131 located in a lowermost portion, and may be lower than a level of a lower surface of an upper gate electrode 132, but an example embodiment is not limited thereto. Even when an aspect ratio of the channel region 140 is increased, the channel region 140 may be stably electrically connected to the substrate 101 by the epitaxial layer 105, and characteristics of the ground selection transistor GST between memory cell strings may be uniform. However, in example embodiments, the epitaxial layer 105 may be omitted. In this case, the channel region 140 may be directly connected to the substrate 101.

The dummy channels DCH may be disposed in both the first region I and the second region II. The dummy channels DCH may have the same structure as that of the channels CH, but may not perform a substantial function in the semiconductor device 100. The dummy channels DCH may form the dummy string DS described above with reference to FIG. 2. In FIG. 3, the dummy channels DCH are illustrated as having the same size and shape as those of the channels CH, but an example embodiment is not limited thereto. In example embodiments, the dummy channels may have a larger size than that of the channels CH, or may have an elliptical shape. The dummy channels DCH may include first dummy channels DCH1 arranged in rows and columns at an end of the gate electrodes 130, second dummy channels DCH2 disposed in a region including the gate connection portion GC between second isolation regions MS2, and third dummy channels DCH3 arranged in the same rule, e.g., pattern, as the channels CH while being adjacent to the channels CH in the first region I, e.g., the third dummy channels DCH3 may be arranged between the first dummy channels DCH1 and the channels CH. A portion of the dummy channels DCH may be included between, e.g., among, the channels CH. For example, channels CH formed to overlap with an upper isolation region SS are not indicated separately, but may correspond to a dummy channel.

Each of the first dummy channel DCH1 and the third dummy channel DCH3 may be arranged in a predetermined manner. The second dummy channels DCH2 may be disposed in a local region including the gate connection portion GC, and may be disposed differently from an arrangement manner of the first dummy channel DCH1 and the third dummy channel DCH3. Thus, due to the second dummy channels DCH2, in the periphery of the gate connection portion GC, a density of the dummy channels DCH may be increased and a pitch may be reduced. The second dummy channels DCH2 may be disposed to be closest to the gate connection portion GC among the dummy channels DCH. Thus, a distance between the gate connection portion GC and the second dummy channel DCH2 adjacent thereto may be smaller than a distance between the gate connection portion GC and the first dummy channel DCH1 adjacent thereto. A portion of the second dummy channels DCH2 may be disposed between the second isolation regions MS2 to pass through the gate connection portion GC, and a portion thereamong may be disposed to be spaced apart from the gate connection portion GC in the y-direction.

At least a portion of the second dummy channels DCH2 may be disposed between the first dummy channels DCH1 adjacent thereto. In detail, the first dummy channels DCH1 may be disposed to be spaced apart from each other by a first separation distance D1 in the x-direction, e.g., the first dummy channels DCH1 may be arranged in columns along the y-direction that are spaced apart from each other along the x-direction by the first separation distance D1. A separation distance D2 along the x-direction between the second dummy channel DCH2 and the first dummy channel DCH1 may be smaller than the first separation distance D1. For example, as illustrated in FIG. 3, the first and second separation distances D1 and D2 may be measured between parallel tangent lines corresponding to facing sidewalls of adjacent dummy channels. For example, as further illustrated in FIG. 3, the second dummy channels DCH2 may be arranged in a column along the y-direction that extends in parallel to and between two adjacent columns of the first dummy channels DCH1, e.g., a distance between adjacent ones of the second dummy channels DCH2 along the y-direction may be different than a distance between adjacent ones of the first dummy channels DCH1 along the y-direction.

A region in which the gate connection portion GC is disposed may be vulnerable to collapsing during a process of manufacturing the semiconductor device 100, e.g., during removal of sacrificial layers during manufacturing. However, the second dummy channels DCH2 passing through the gate electrodes 130 to be extended from the substrate 101 are disposed in a local region including the gate connection portion GC, thereby performing a supporting role and thus preventing collapsing.

The first isolation region MS1 and the second isolation region MS2 may be disposed to be extended in the x-direction in the first region I and the second region II. The first isolation regions MS1 and the second isolation regions MS2 may be alternately disposed in the y-direction, and the second isolation regions MS2 may be disposed to be spaced apart from each other in a straight line in the x-direction. That is, as illustrated in FIG. 3, the first isolation regions MS1 may extend in the x-direction and be spaced apart from each other in the y-direction, and the second isolation regions MS2 may extend in the x-direction and be spaced apart from each other in the x-direction, e.g., the second isolation regions MS2 may extend in parallel to and between two adjacent first isolation regions MS1. The first isolation region MS1 and the second isolation region MS2 may pass through the entirety of the gate electrodes 130 stacked on the substrate 101 to be connected to the substrate 101. A placement order of the first isolation regions MS1 and the second isolation regions MS2 is not limited to that illustrated in FIG. 3. For example, in example embodiments, the second isolation regions MS2 may be arranged in two or more rows between the first isolation regions MS1 in the y-direction.

The first isolation regions MS1 may include the common source line CSL illustrated with reference to FIG. 2, and the second isolation regions MS2 may include a dummy common source line. As illustrated in FIGS. 4A and 4D, the first isolation region MS1 and the second isolation region MS2 may include an insulating layer 107 and a conductive layer 110 insulated from the gate electrodes 130 by the insulating layer 107. A conductive layer 110 of the first isolation regions MS1 may correspond to the common source line CSL, and the conductive layer 110 of the second isolation regions MS2 may correspond to a dummy common source line. Thus, the conductive layer 110 forming the second isolation regions MS2 may be in a floating state, i.e., a state of non-connection to elements for driving the semiconductor device 100 or a state in which an electrical signal is not applied, in a manner different from the conductive layer 110 in the first isolation regions MS1 corresponding to the common source line CSL.

The upper isolation regions SS may be extended in the x-direction between the first isolation regions MS1 and the second isolation region MS2. The upper isolation regions SS may be disposed in a portion of the second region II and the first region I, in order to pass through a portion of the gate electrodes 130 including an eighth gate electrode 138 located in an uppermost portion among the gate electrodes 130. The gate electrodes 130 separated by the upper isolation regions SS may form different string selection lines SSL (see FIG. 2). The upper isolation regions SS may include the upper insulating layer 103. As illustrated in FIG. 4D, the upper isolation regions SS may extend to a predetermined depth with the upper insulating layer 103 therein, so the upper insulating layer 103 may allow a total of three gate electrodes 130, including the eighth gate electrode 138 located in an uppermost portion, to be separated from each other in the y-direction. However, the number of the gate electrodes 130 separated by the upper insulating layer 103 is not limited thereto.

The lower isolation region GS may be disposed in a region including the gate connection portion GC on a plane, and may be disposed on the same level as that of the first gate electrode 131 (FIGS. 4A and 4C). In detail, as illustrated in FIG. 4C, the first gate electrode 131 may be divided in the y-direction in a lower portion of the gate connection portion GC by the lower isolation region GS. The lower isolation region GS may include a lower insulating layer 170. As illustrated in FIG. 4C, the lower isolation region GS may be disposed to allow the first gate electrode 131 to be separated in the y-direction in the lower portion of the gate connection portion GC.

Figure 5:
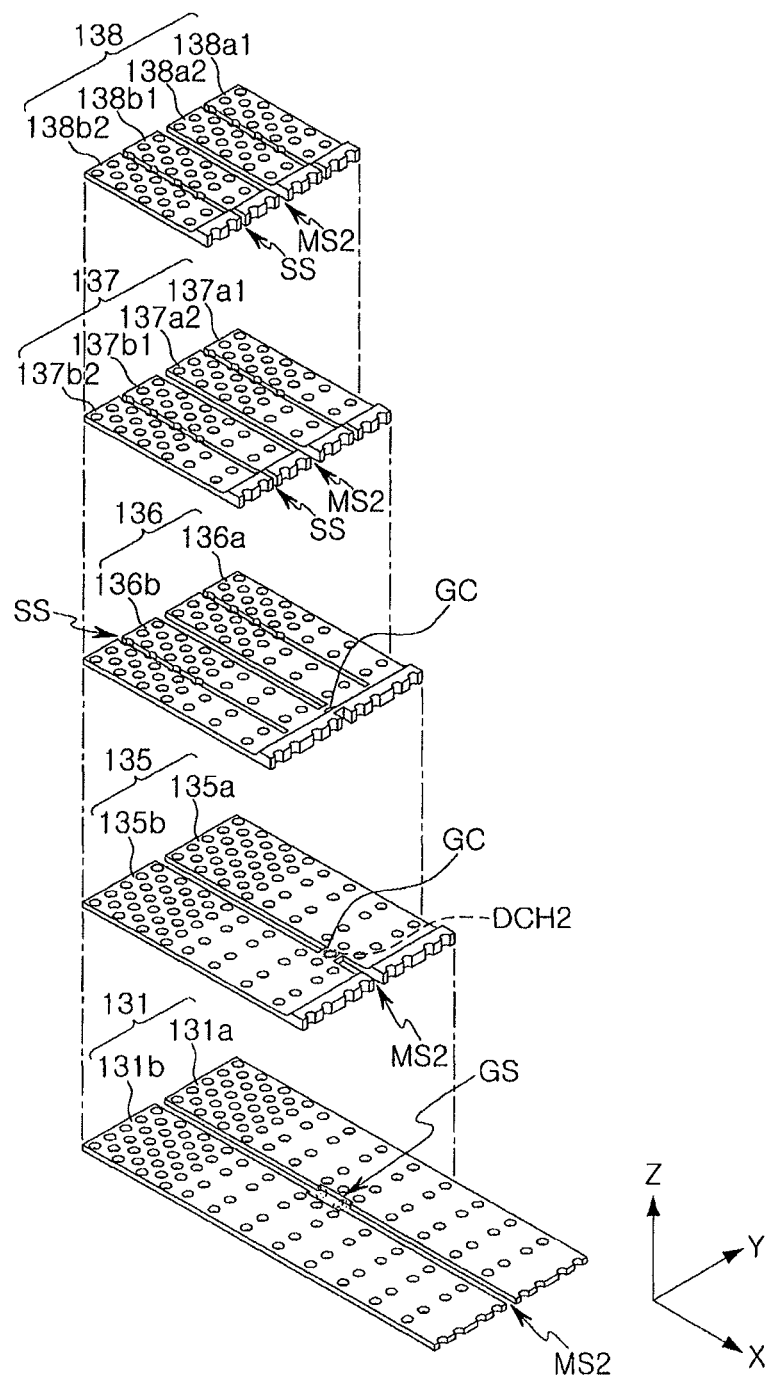
FIG. 5 illustrates an exploded perspective view of gate electrodes of a semiconductor device according to example embodiments.

FIG. 5 is an exploded perspective view illustrating the gate electrodes 130 of the semiconductor device 100 according to example embodiments. In detail, FIG. 5 illustrates a portion among the gate electrodes 130 disposed between the first isolation regions MS1 of FIG. 3.

Referring to FIG. 5, a seventh gate electrode 137 and an eighth gate electrode 138 among the gate electrodes 130, located in an uppermost portion, may be used as the string select line SSL, and each of the seventh gate electrode 137 and the eighth gate electrode 138 may be divided into four subgate electrodes (e.g., first through fourth subgate electrodes 137a1, 137a2, 137b1, and 137b2, and first through fourth subgate electrodes 138a1, 138a2, 138b1, and 138b2) in the y-direction by the upper isolation regions SS and the second isolation regions MS2. Each of the subgate electrodes 137a1 to 137b2 and 138a1 to 138b2 may be connected to different contact plugs to receive electrical signals independently, e.g., the subgate electrodes 137a1 to 137b2 and 138a1 to 138b2 may be electrically completely separated from each other.

In a fifth gate electrode 135 and a sixth gate electrode 136 below the seventh gate electrode 137 and the eighth gate electrode 138, subgate electrodes 135a, 135b, 136a, and 136b, having the second isolation regions MS2 as a boundary, are not separated from each other, and may be connected to each other as a single layer. In detail, the subgate electrodes 135a, 135b, 136a, and 136b may be connected to each other by the gate connection portions GC, and thus may be disposed as a single fifth gate electrode 135 and a single sixth gate electrode 136.

For example, as illustrated in FIG. 5, the gate connection portion GC may be a portion extending integrally with each of the subgate electrodes, e.g., of a same material and same thickness to connect seamlessly the subgate electrodes to each other. For example, as illustrated in FIG. 5, the gate connection portion GC in the fifth gate electrode 135 extends integrally with each of the subgate electrodes 135a and 135b (e.g., of a same material and same thickness as the subgate electrodes 135a and 135b), and between the two adjacent second isolation regions MS2. For example, as illustrated in FIG. 5, the gate connection portion GC of the fifth gate electrode 135 may be the entire solid portion between the two adjacent second isolation regions MS2 in the x-direction and between the subgate electrodes 135a and 135b in the y-direction (framed by the dashed frame), so that the gate connection portion GC of the fifth gate electrode 135 may include a single second dummy channel therethrough, and two second dummy channels adjacent to the gate connection portion GC, e.g., the adjacent two second dummy channels may be formed through the subgate electrodes 135a and 135b, respectively.

The second gate electrode 132, the third gate electrode 133, and the fourth gate electrode 134, not illustrated in FIG. 5, may have a form connected by the gate connection portions GC in a similar manner to the fifth gate electrode 135 and the sixth gate electrode 136. Thus, the gate connection portions GC may allow gate electrodes 130, located below the sixth gate electrode 136, to be connected as one between the first isolation regions MS1, so the number of contact plugs connected thereto may be significantly reduced. Thus, a wiring structure connected to the gate electrodes 130 may be simplified.

As further illustrated in FIG. 5, the first gate electrode 131 located in a lowermost portion among the gate electrodes 130 may be used as the ground select line GSL, and may be divided into subgate electrodes 131a and 131b by the lower isolation region GS and the second isolation regions MS2. The lower isolation region GS is disposed to include a region between the second isolation regions MS2, so the first gate electrode 131 may be divided by a combination of the lower isolation region GS and the second isolation regions MS2. Each of the subgate electrodes 131a and 131b may have a bent portion or curvature in surfaces opposing each other. The bent portion may be provided by a difference in width between the lower isolation region GS and the second isolation regions MS2 in the y-direction. However, a relative size of a width of the lower isolation region GS and a width of the second isolation regions MS2 is not limited thereto, and may be variously changed in example embodiments.

FIGS. 6 through 11 are schematic plan views of a semiconductor device according to example embodiments.

Figure 6:
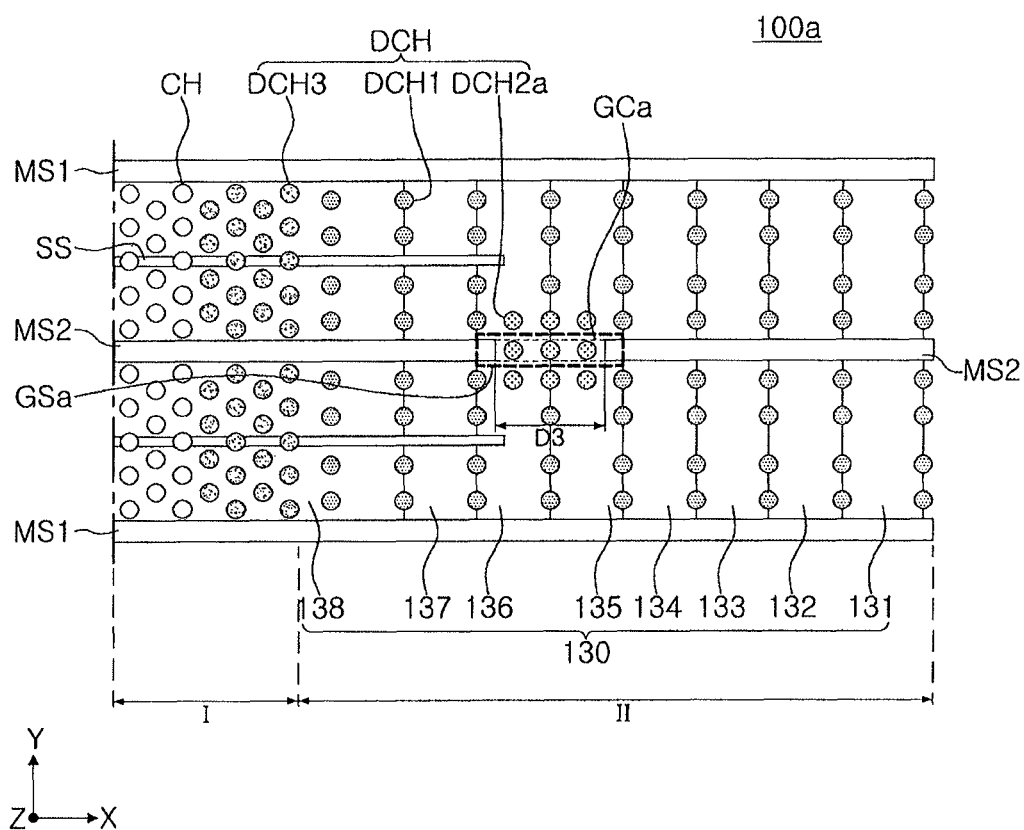
FIGS. 6 through 11 illustrate schematic plan views of a semiconductor device according to example embodiments.

Referring to FIG. 6, in a semiconductor device 100a, in a manner different from the example embodiment of FIG. 3, the number of second dummy channels DCH2a disposed to pass through a gate connection portion GCa between the second isolation regions MS2 may be two or more, e.g., three. The number of the second dummy channels DCH2a disposed to be adjacent to the gate connection portion GCa may be four or more, e.g., six, and may be disposed between the first dummy channels DCH1. In example embodiments, the second dummy channels DCH2a may be disposed in a row in the y-direction, as illustrated in the drawing, or may be shifted and arranged in zigzag form.

In an example embodiment, a gap between the second isolation regions MS2 is greater, compared to the example embodiment of FIG. 3, so a length D3 in the x-direction of the gate connection portion GCa and a length in the x-direction of a lower isolation region GSa may be relatively great. In example embodiments, the length D3 in the x-direction of the gate connection portion GCa may be variously changed. Thus, the number of the second dummy channels DCH2a, passing through the gate connection portion GCa or disposed to be adjacent to the gate connection portion GCa, may be variously changed.

Figure 7:
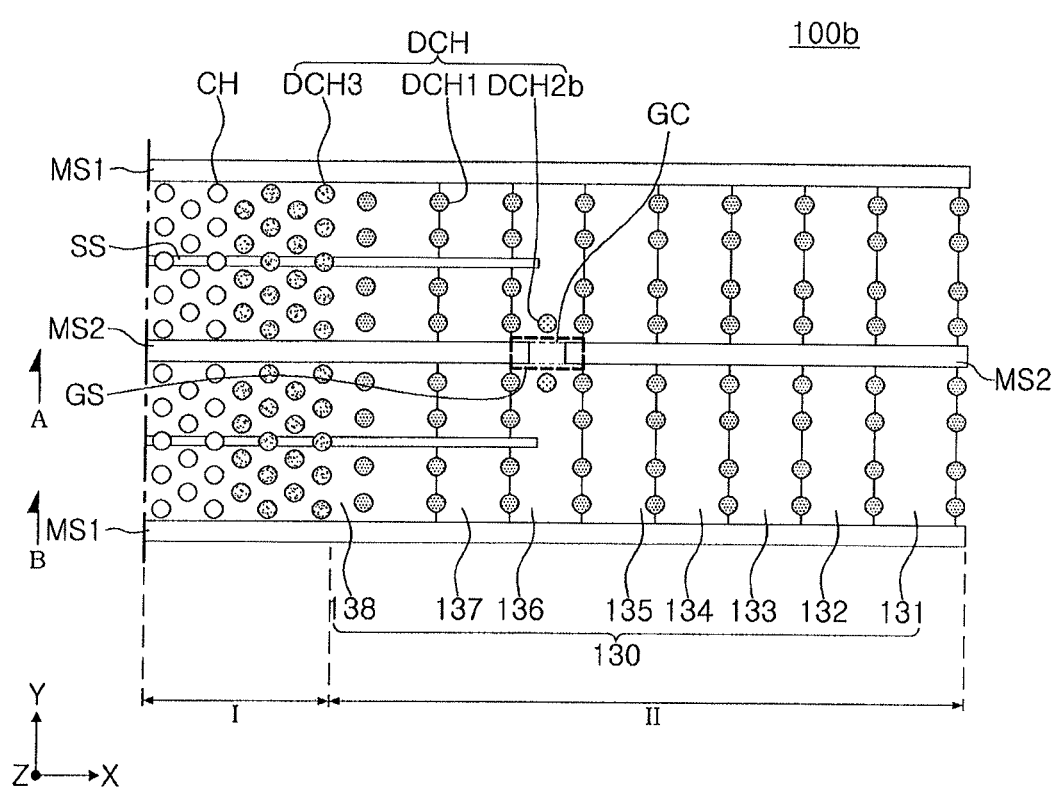

Referring to FIG. 7, a semiconductor device 100b, in a manner different from the example embodiment of FIG. 3, may not include a second dummy channel DCH2b disposed to pass through the gate connection portion GC between the second isolation regions MS2. Thus, the second dummy channel DCH2b may not pass through the gate connection portion GC itself, but may be disposed only in a region adjacent thereto. The arrangement described above may be applied to, e.g., a case in which a gap between the second isolation regions MS2 is narrow, but an example embodiment is not limited thereto.

Figure 8:
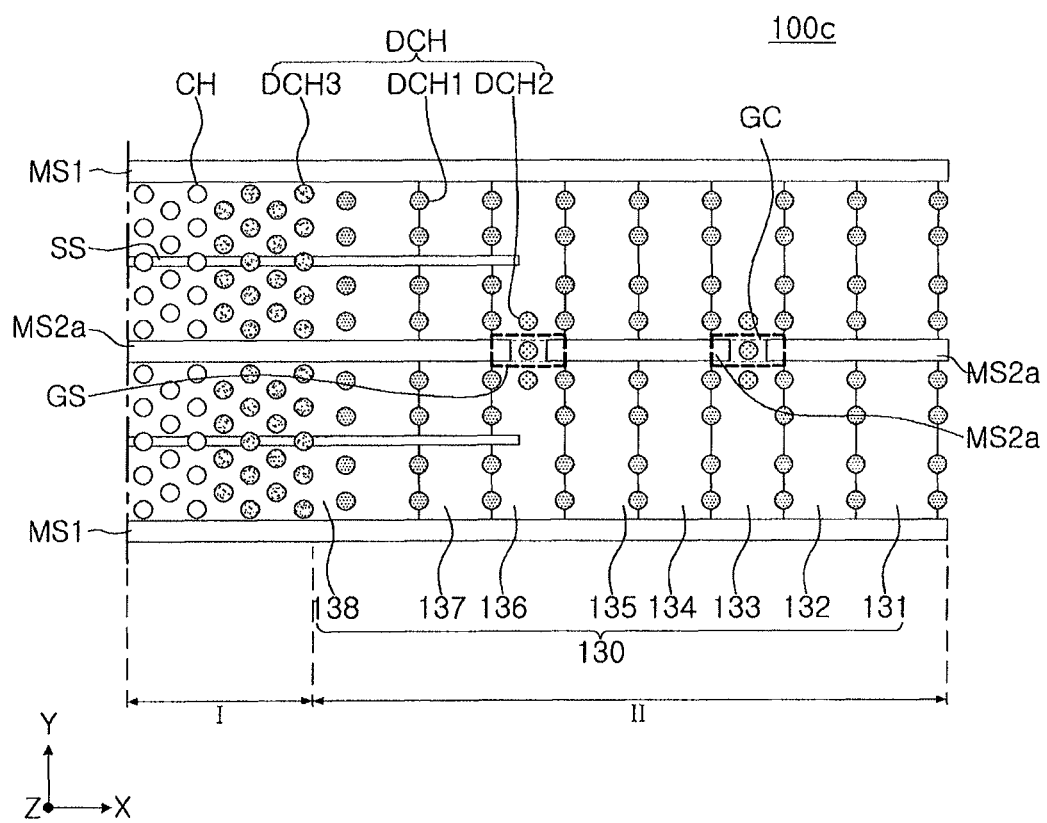

Referring to FIG. 8, a semiconductor device 100c, in a manner different from the example embodiment of FIG. 3, may include three or more second isolation regions MS2a disposed in a straight line in the x-direction, and thus may include two or more gate connection portions GC. The gate connection portions GC in an example embodiment may be disposed in a second region II. The number of the gate connection portions GC may be variously selected in consideration of a length of the second region II, an aspect ratio of a stacked structure of the gate electrodes 130, a process, and the like, in example embodiments.

Figure 9:
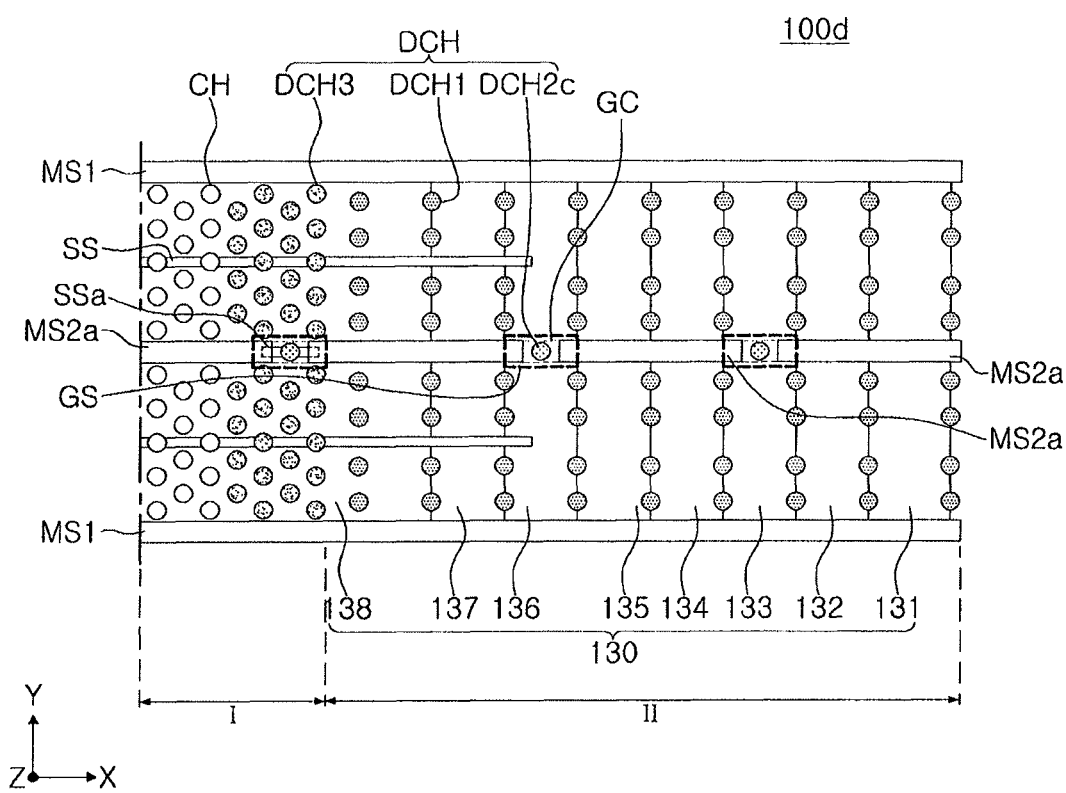

Referring to FIG. 9, a semiconductor device 100d, in a manner different from the example embodiment of FIG. 3, may include four or more second isolation regions MS2a disposed in a straight line in the x-direction, and thus may include three or more gate connection portions GC. In an example embodiment, in a manner different from the example embodiment of FIG. 8, the gate connection portions GC may not only be disposed in the second region II but also in the first region I. In an example embodiment, one of the gate connection portions GC is disposed to be adjacent to a portion of the first region I, in which the third dummy channels DCH3 are disposed, but an example embodiment is not limited thereto. In example embodiments, the gate connection portion GC may be disposed to be adjacent to a region in which the channels CH are disposed. When the gate connection portions GC are disposed in the first region I, or may be disposed in a portion in the second region II, close to the first region I, an auxiliary upper isolation region SSa passing through a portion of the gate electrodes 130 may be further disposed between the second isolation regions MS2a. In other words, when the gate connection portions GC are disposed to be closer to the first region I than one end of a seventh gate electrode 137 divided by an upper isolation region SS, even in the second region II, in order to allow the seventh gate electrode 137 and the eighth gate electrode 138 not to be connected to each other by the gate connection portions GC, the auxiliary upper isolation region SSa may be disposed in parallel with the upper isolation region SS.

In addition, in an example embodiment, in a manner different from the example embodiments of FIGS. 3 and 8, a second dummy channel DCH2c is disposed to pass through the gate connection portion GC between the second isolation regions MS2a, and may not be disposed in a region between the first dummy channels DCH1 adjacent to the gate connection portion GC. However, in example embodiments, in the gate connection portions GC, the arrangement of the second dummy channel DCH2c in a periphery of the gate connection portions GC may be different from each other. For example, the second dummy channel DCH2c may not be disposed in a periphery of the gate connection portion GC of the first region I, and the second dummy channels DCH2c may be disposed in a periphery of the gate connection portion GC of the second region II as illustrated in FIG. 3.

Figure 10:
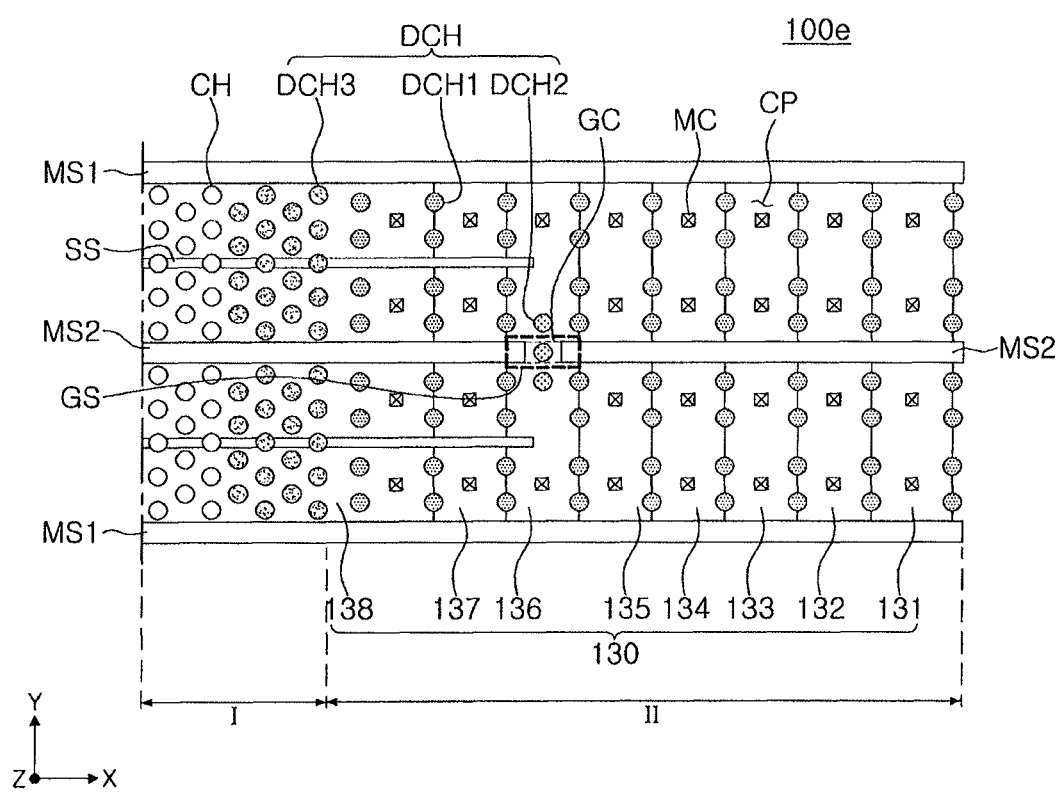
Figure 11:
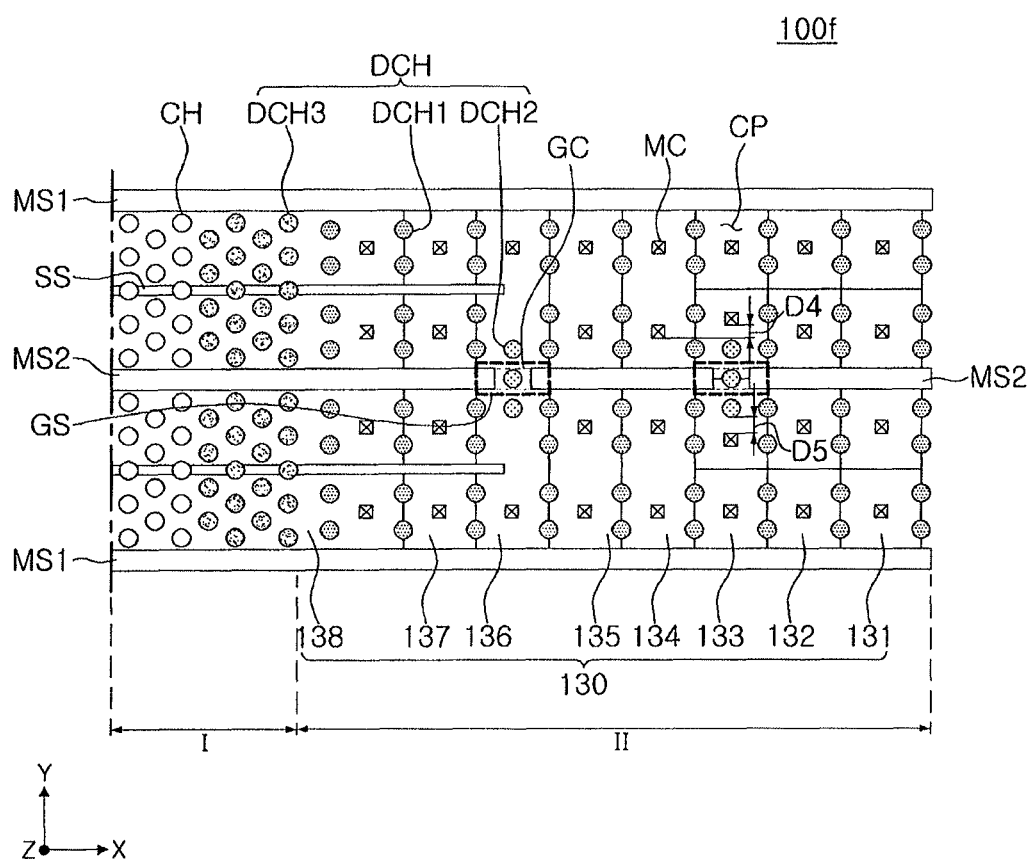

Referring to FIGS. 10 and 11, semiconductor devices 100e and 100f may further include contact plugs MC disposed in a stepped region of the gate electrodes 130, i.e., in the contact regions CP. The contact plugs MC may allow each of the gate electrodes 130 to be connected to an upper wiring structure, and may be formed of a conductive material.

As illustrated in FIG. 10, in a contact region CP in which the gate connection portion GC is exposed, i.e., in the contact region CP including the gate connection portion GC, at least a portion of the contact plugs MC may be omitted. For example, while the contact plugs MC are regularly arranged in the contact regions CP not including the gate connection portion GC, some of the contact plugs MC may be omitted from the exposed upper surface of the sixth gate electrode 136 in a periphery of the second dummy channel DCH2. Even in this case, the sixth gate electrode 136 is connected as one by the gate connection portion GC, and thus may be connected to the wiring structure through the remaining contact plugs MC, e.g., at edges of the exposed upper surface of the sixth gate electrode 136.

As illustrated in FIG. 11, a portion among the gate electrodes 130, a first gate electrode 131, a second gate electrode 132, and a third gate electrode 133, are disposed to have a stepped portion not only in the x-direction but also in the y-direction, so respective contact regions CP are formed.

Thus, each of the first gate electrode 131, the second gate electrode 132, and the third gate electrode 133 may be formed of four gate electrodes 130. Such a structure will be described in more detail in FIG. 12.

At least one contact plug MC is required to be disposed in each of the contact regions CP, so the contact plugs MC may be disposed to be shifted in the y-direction in the contact regions CP of the third gate electrode 133 including the gate connection portion GC. In other words, in the contact regions CP of the third gate electrode 133 adjacent to the gate connection portion GC, the contact plug MC may be disposed to be shifted to be away from the gate connection portion GC by a distance D4 in the y-direction, as compared to the contact plugs MC of different gate electrodes 130. Thus, a distance D5 between the contact plug MC and a second dummy channel DCH2 adjacent thereto may be secured. For example, the distance D5 may be about 50 nm or more, e.g., about 50 nm to about 200 nm.

Figure 12:
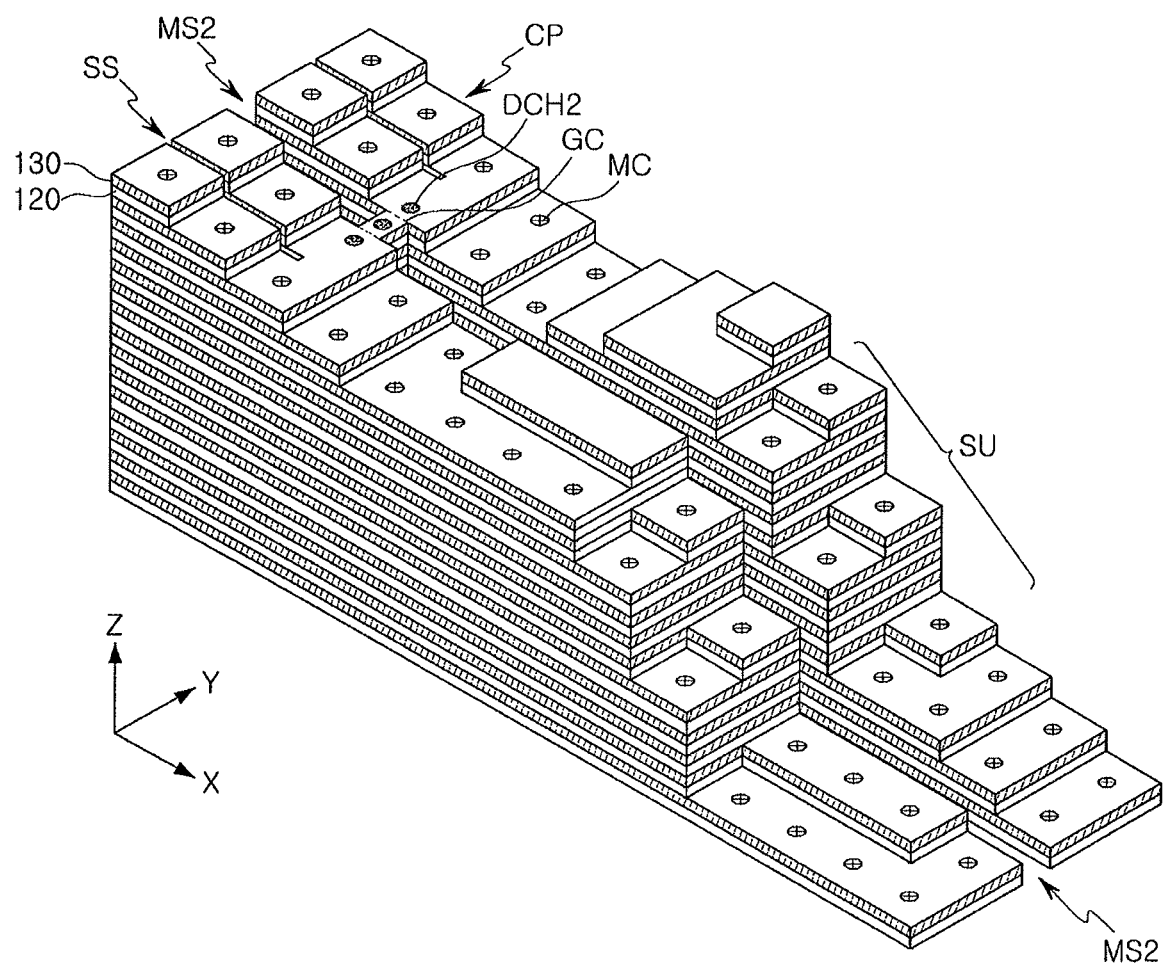
FIG. 12 illustrates a perspective view of a portion of a semiconductor device according to example embodiments.

FIG. 12 is a perspective view illustrating a portion of a configuration of a semiconductor device according to example embodiments.

Referring to FIG. 12, a stacked structure of the gate electrodes 130, the interlayer insulating layers 120, the second dummy channels DCH2, and the contact plugs MC disposed to pass through the stacked structure are illustrated. The stacked structure is a portion corresponding to a region between the first isolation regions MS1 of FIG. 3, and the gate electrodes 130 may be disposed in a similar manner to the semiconductor device 100 described above with reference to FIGS. 3 through 4D. A portion of the gate electrodes 130 may be separated by the second isolation regions MS2 between the first isolation regions MS1, and a portion of the gate electrodes 130 may be connected as a single layer by the gate connection portion GC. The gate connection portion GC may be formed to be relatively narrow, and thus may be vulnerable to safety during a process, but the second dummy channels DCH2 may perform a supporting role. In example embodiments, depending on the number of the gate electrodes 130, a region having a structure corresponding to a unit stacked structure SU may be added.

In a manner different from that of the example embodiment of FIG. 3, in the gate electrodes 130 according to an example embodiment, a portion of the gate electrodes 130 is formed to have a stepped portion not only in the x-direction but also in the y-direction, thereby forming respective contact regions CP. Thus, at least one among the contact plugs MC formed in a gate electrode 130 connected as a single layer may be connected to an upper wiring structure. In an example embodiment, a portion of the gate electrodes 130 may be connected as a single layer by the gate connection portion GC. Thus, even when contact regions CP having a stepped portion in the y-direction is formed, the entirety of one gate electrode 130 may be electrically connected to an upper wiring structure by at least one contact plug MC. Thus, compared to a case without the gate connection portion GC, the number of contact plugs MC required to be connected to the wiring structure may be reduced, so a wiring structure may be further simplified.

FIGS. 13A through 18B are schematic plan views and cross-sectional views illustrating stages in a method of manufacturing a semiconductor device according to example embodiments.

Figure 13A:
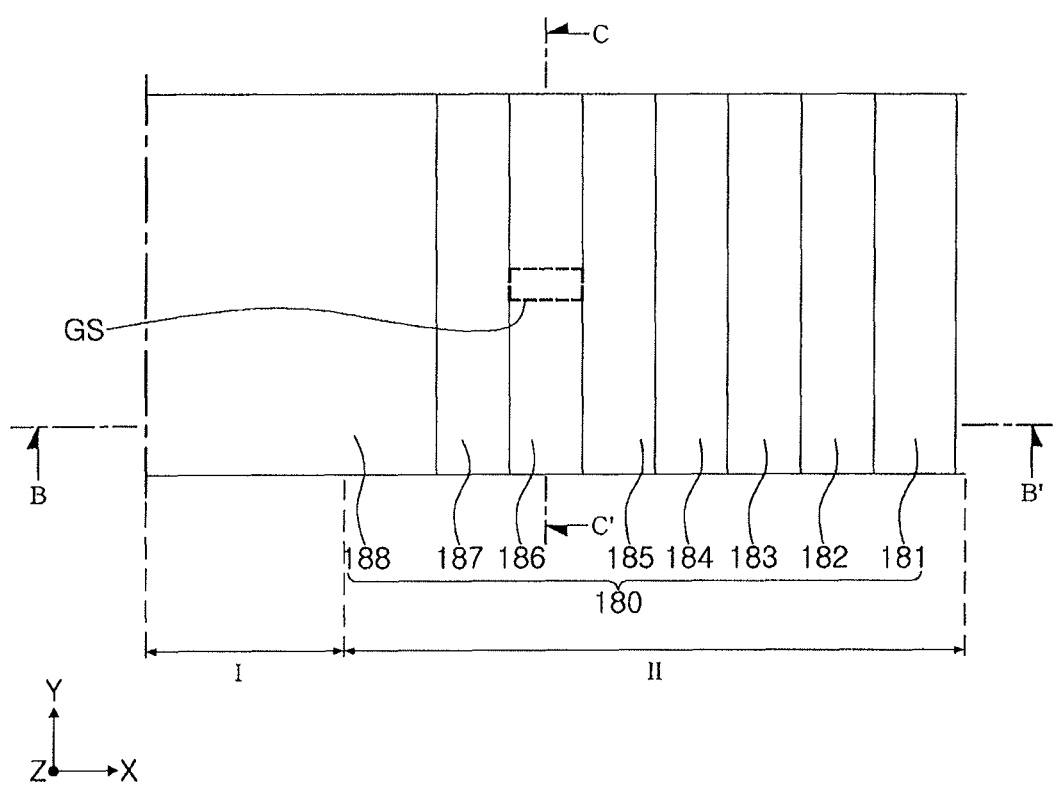
FIGS. 13A-13C, 14A, 14B, 15A, 15B, 16A, 16B, 17A, 17B, 18A, and 18B illustrate schematic plan views and cross-sectional views of stages in a method of manufacturing a semiconductor device according to example embodiments.
Figure 13B:
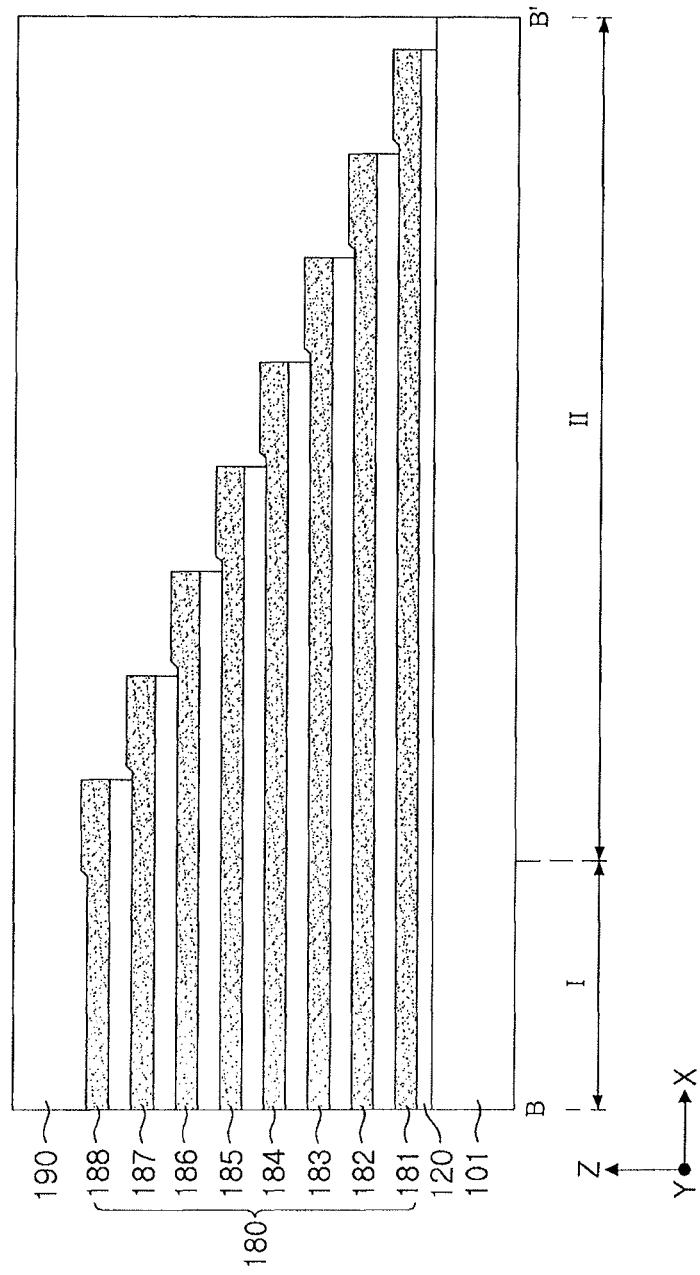
Figure 13C:
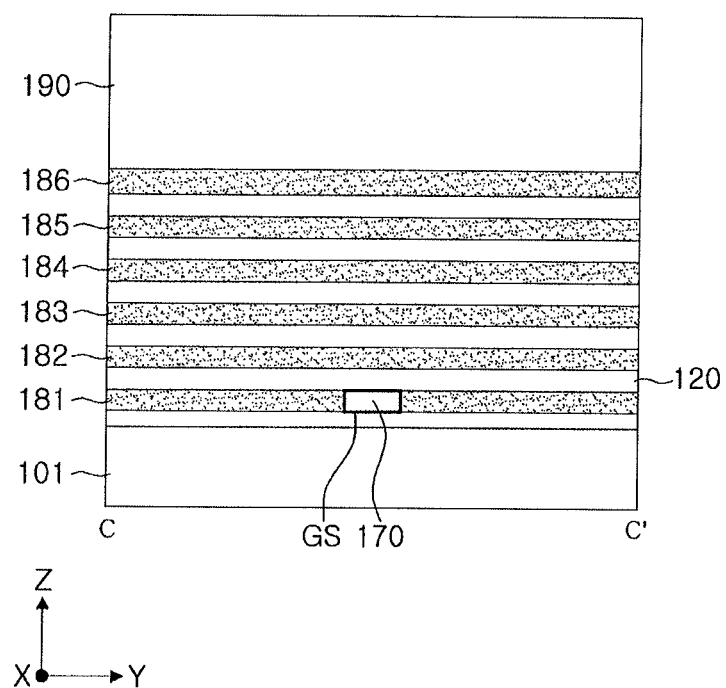

Referring to FIGS. 13A through 13C, the lower isolation region GS, sacrificial layers 180 (e.g., sacrificial layers 181 to 188), and the interlayer insulating layers 120 are alternately stacked on the substrate 101, and a portion of the sacrificial layers 180 and the interlayer insulating layers 120 may be removed in order to allow the sacrificial layers 180 to be extended by different lengths in the x-direction.

In detail, after a first sacrificial layer 181 located in a lowermost portion is formed, e.g., on a first interlayer insulating layer 120, a patterning process and a deposition process of an insulating material are performed. For example, a portion of the first sacrificial layer 181 may be removed, and an insulating material may be deposited to replace the removed portion of the first sacrificial layer 181. Thus, as illustrated in FIG. 13C, the lower isolation region GS including the lower insulating layer 170 may be formed. The lower insulating layer 170 may be formed of a material having an etch selectivity with respect to the sacrificial layers 180, and may be formed of, e.g., the same material as the interlayer insulating layer 120.

The sacrificial layers 180 may be layers to be replaced with the gate electrodes 130 in a subsequent process. The sacrificial layers 180 may be formed of a material to be etched with an etch selectivity with respect to the interlayer insulating layers 120. For example, the interlayer insulating layer 120 may be formed of at least one of silicon oxide and silicon nitride, and the sacrificial layers 180 may be formed of a different material from the interlayer insulating layer 120, e.g., of silicon, silicon oxide, silicon carbide, and silicon nitride. In example embodiments, thicknesses of the interlayer insulating layers 120 may not be uniform. For example, an interlayer insulating layer 120 located in a lowermost portion may be formed to be relatively thin, and an interlayer insulating layer 120 located in an uppermost portion may be formed to be relatively thick. Thicknesses of the interlayer insulating layers 120 and the sacrificial layers 180 and the number of films forming the same may be variously changed from those illustrated.

In order to allow sacrificial layers 180 located in an upper portion to be extended by a distance shorter than sacrificial layers 180 located in a lower portion in the second region II (along the x-direction), a photolithography process and an etching process for the sacrificial layers 180 may be repeatedly performed. The sacrificial layers 180 may be formed in a stepped shape thereby. Next, a material forming the sacrificial layers 180 is additionally disposed in regions, which are exposed as sacrificial layers 180 are extended further than the sacrificial layers 180 located in an upper portion, so the sacrificial layers 180 may be formed to be relatively thick at an end portion. Next, the peripheral region insulating layer 190 covering an upper portion of a stacked structure of the sacrificial layers 180 and the interlayer insulating layers 120 may be formed.

Figure 14A:
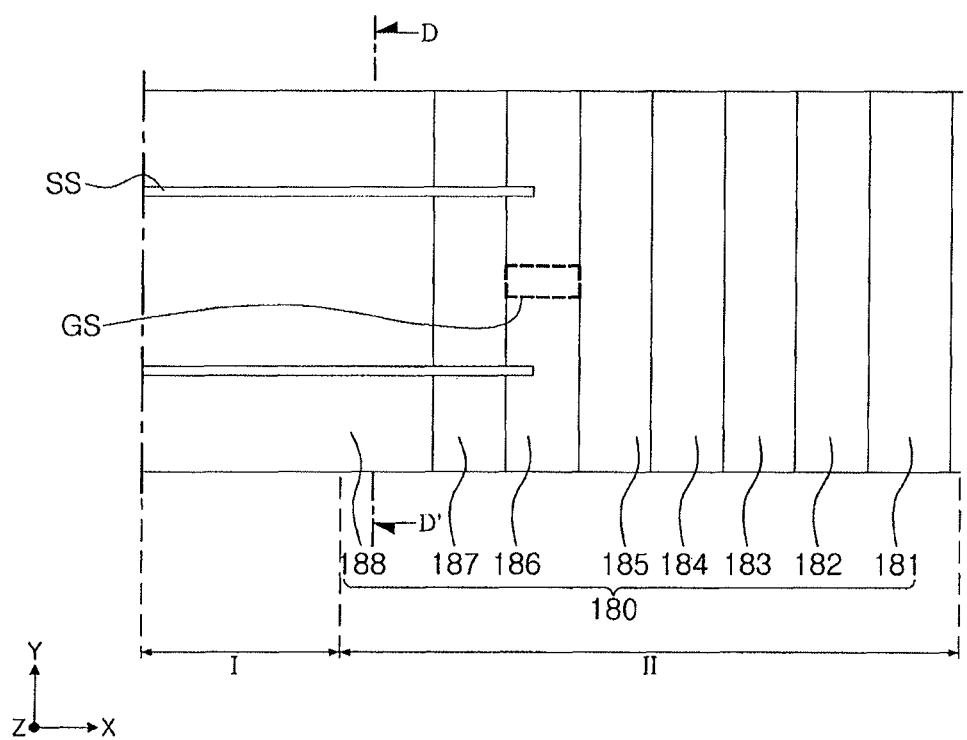
Figure 14B:
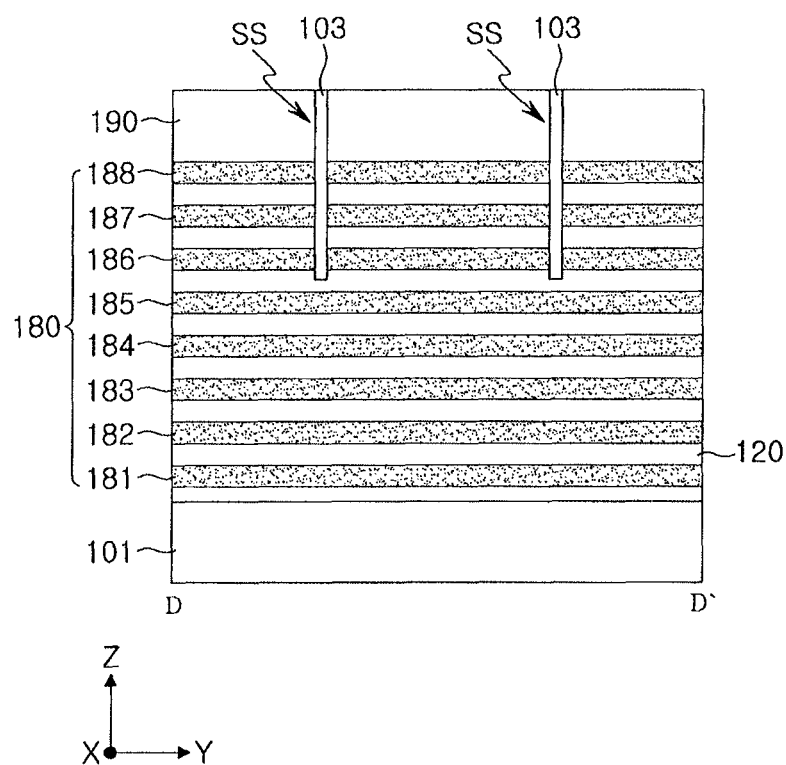

Referring to FIGS. 14A and 14B, the upper isolation region SS including the upper insulating layer 103 may be formed by removing a portion of the sacrificial layers 180 and the interlayer insulating layers 120.

The upper isolation region SS may be extended in the x-direction from the first region I to a portion of the second region II, and may extend to a predetermined depth in the z-direction. A separate mask layer is used to expose a region in which the upper isolation region SS is to be formed, and the predetermined number of the sacrificial layers 180 and the interlayer insulating layers 120 may be removed from the top. An insulating material is deposited in a region from which the sacrificial layers 180 and the interlayer insulating layers 120 are removed, so the upper insulating layer 103 may be formed. The upper insulating layer 103 may be formed of a material having an etch selectivity with respect to the sacrificial layers 180, and may be formed of, e.g., the same material as the interlayer insulating layer 120.

Figure 15A:
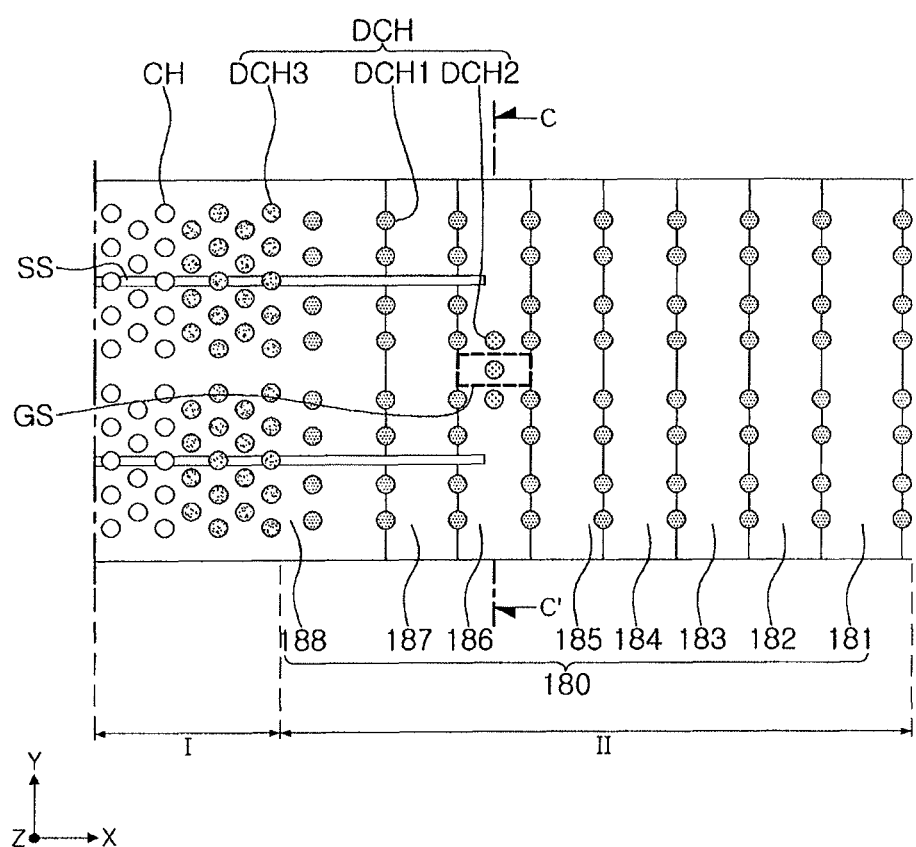
Figure 15B:
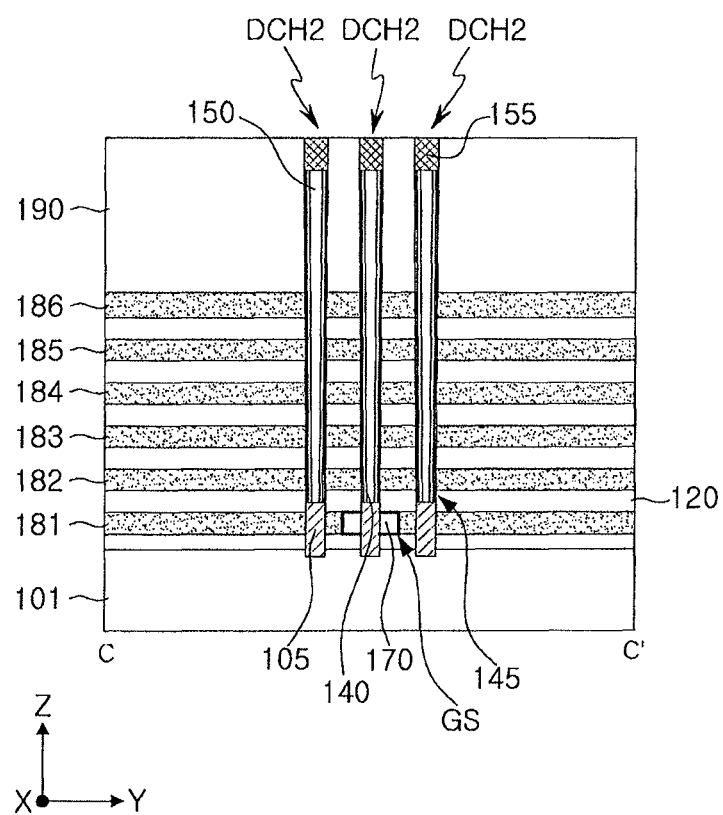

Referring to FIGS. 15A and 15B, the channels CH and the dummy channels DCH passing through the stacked structure of the sacrificial layers 180 and the interlayer insulating layers 120 may be formed. The channels CH and the dummy channels DCH may be formed by anisotropically etching the sacrificial layers 180 and the interlayer insulating layers 120, and may be provided in a hole shape.

Due to a height of the stacked structure, a side wall of the channels CH and the dummy channels DCH may not be perpendicular to an upper surface of the substrate 101. In example embodiments, the channels CH and the dummy channels DCH may be formed to recess a portion of the substrate 101. Next, in the channels CH and the dummy channels DCH, the epitaxial layer 105, at least a portion of the gate dielectric layer 145, the channel region 140, the channel insulating layer 150, and the channel pads 155 may be formed. The channels CH and the dummy channels DCH may have the same size, shape, and structure, but an example embodiment is not limited thereto. The first dummy channels DCH1 among the dummy channels DCH may be disposed in an outer side of the channels CH, the second dummy channels DCH2 may be disposed in a boundary of an end of the gate electrodes 130, and the third dummy channels DCH3 may be disposed in a region including the lower isolation region GS.

The epitaxial layer 105 may be formed using a selective epitaxial growth (SEG) process. The epitaxial layer 105 may be formed of a single layer or a plurality of layers. The epitaxial layer 105 may include impurity doped or undoped polycrystalline silicon, single crystalline silicon, polycrystalline germanium, or single crystalline germanium.

The gate dielectric layer 145 may be formed to have a uniform thickness using an atomic layer deposition (ALD) or chemical vapor deposition (CVD) process. An entirety or a portion of the gate dielectric layer 145 may be formed in an operation described above, and a portion extended to be perpendicular to the substrate 101 along the channels CH, e.g., the tunneling layer 142 and the charge storage layer 143 of FIG. 4A, may be formed in the operation described above. The channel region 140 may be formed on the gate dielectric layer 145 in the channels CH. The channel insulating layer 150 is formed to fill the channels CH, and may be an insulating material. However, according to example embodiments, a gap between channel regions 140 may be filled with a conductive material rather than the channel insulating layer 150. The channel pad 155 may be formed of a conductive material, and may be formed of, e.g., polycrystalline silicon.

Figure 16A:
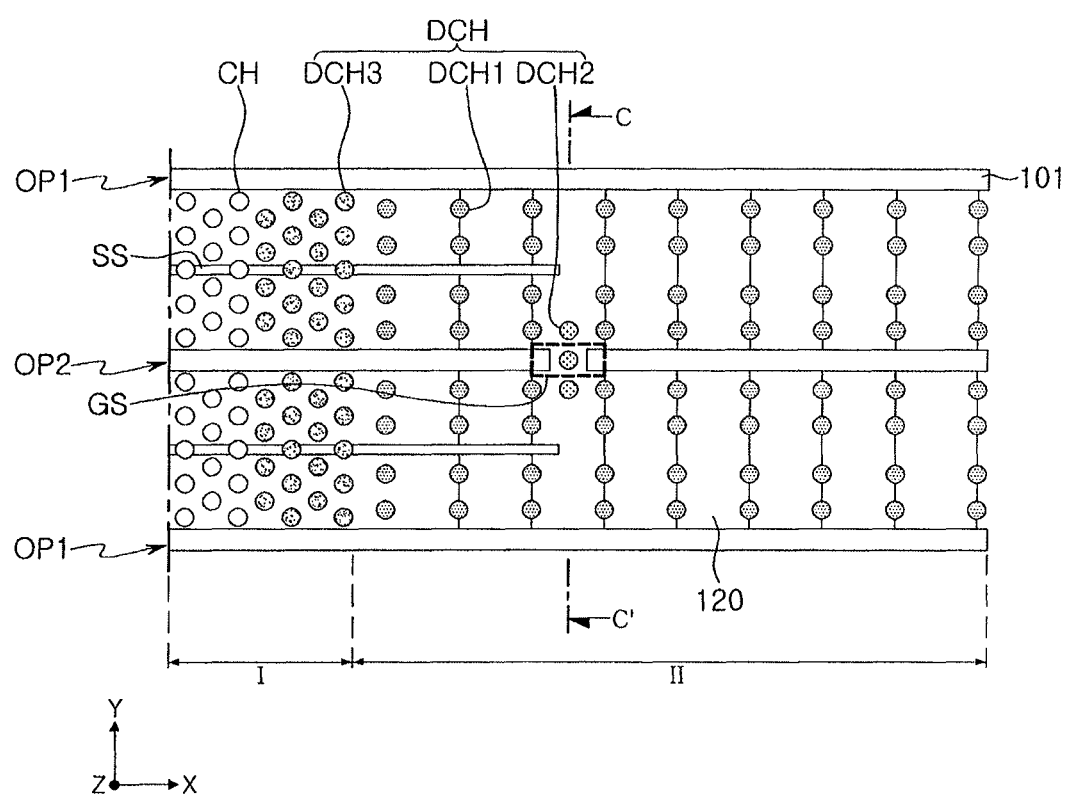
Figure 16B:
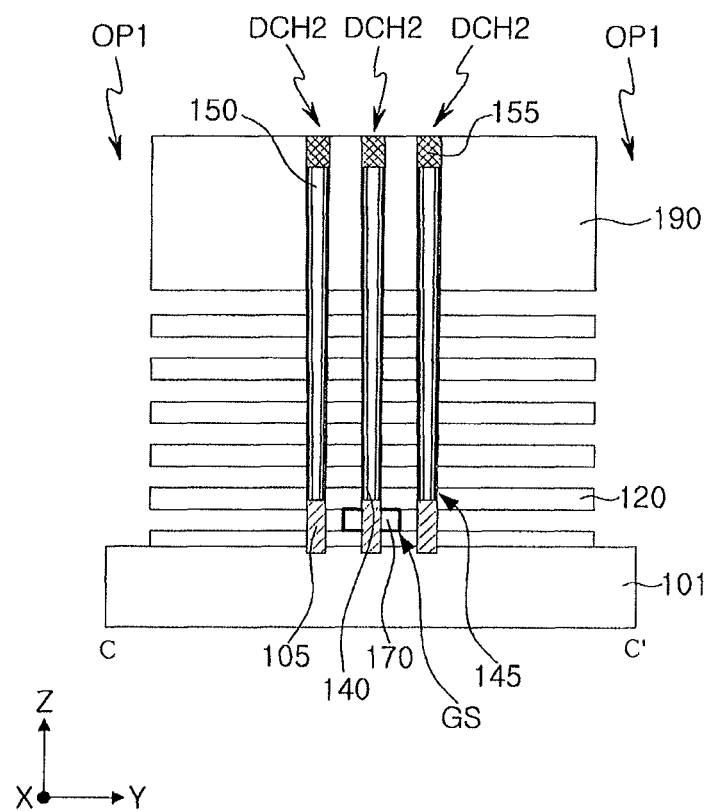

Referring to FIGS. 16A and 16B, a first opening OP1 and a second opening OP2, passing through the stacked structure of the sacrificial layers 180 and the interlayer insulating layers 120 are formed, and the sacrificial layers 180, having been exposed therethrough, may be removed.

The first opening OP1 and the second opening OP2 may be formed by forming a mask layer using a photolithography process, and anisotropically etching the stacked structure. The first opening OP1 and the second opening OP2 may be formed in a trench shape extended in the x-direction. In an operation described above, the substrate 101 may be exposed below the first opening OP1 and the second opening OP2.

The sacrificial layers 180 may be selectively removed with respect to the interlayer insulating layers 120, using, e.g., wet etching. Thus, a plurality of side openings may be formed between the interlayer insulating layers 120, and a portion of side walls of the gate dielectric layer 145 in the channels CH and the dummy channels DCH and a side wall of the lower insulating layer 170 may be exposed through the side openings. In an operation described above, after the sacrificial layers 180 are removed, stability of a stacked structure of the interlayer insulating layer 120 may be reduced. In detail, a region between the second openings OP2 may be vulnerable to collapsing. However, as the second dummy channels DCH2 are disposed, the stacked structure of the interlayer insulating layer 120 may be more stably supported in the region between the second openings OP2.

Figure 17A:
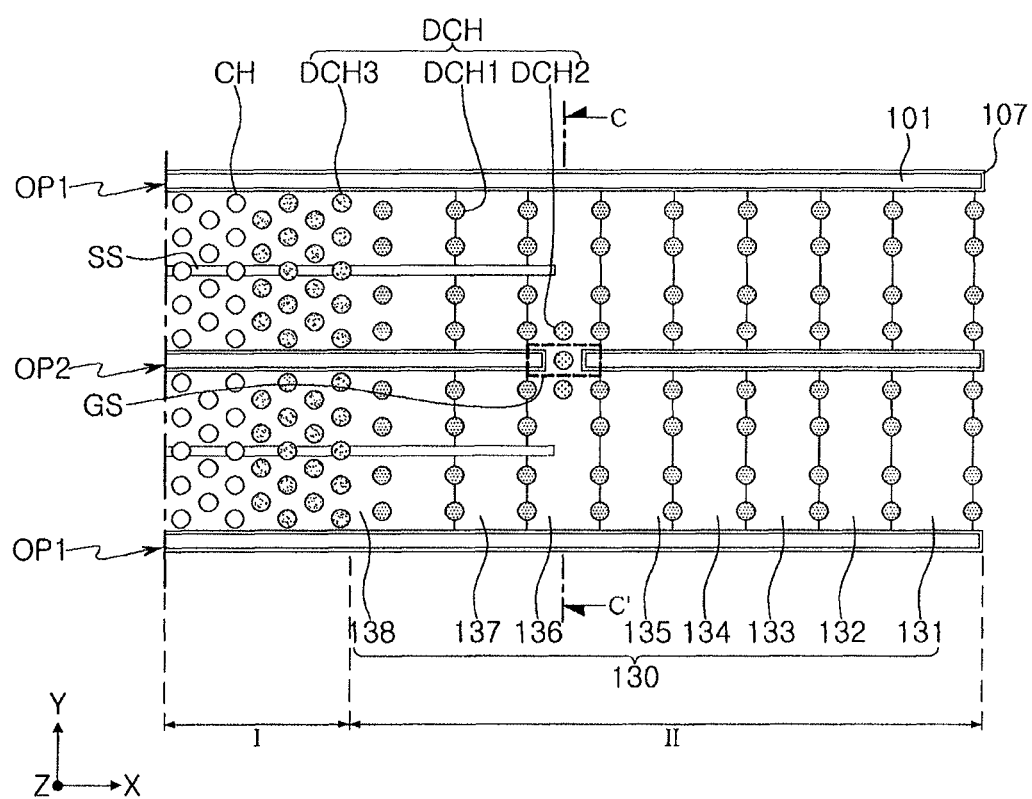
Figure 17B:
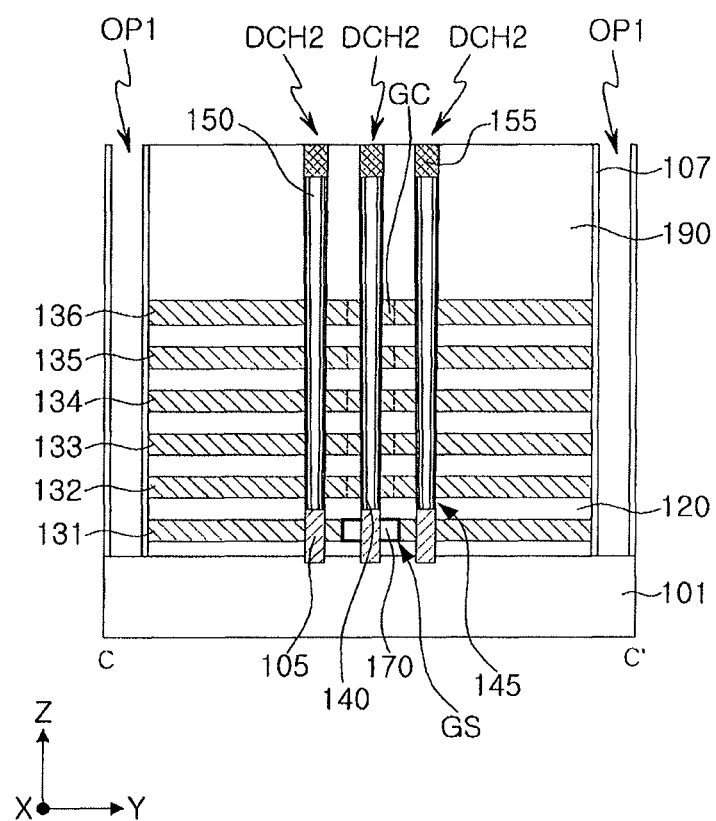

Referring to FIGS. 17A and 17B, a conductive material is filled in a region from which the sacrificial layers 180 are removed to form the gate electrodes 130, and the insulating layer 107 may be formed in the first opening OP1 and the second opening OP2. The gate electrodes 130 may include, e.g., metal, polycrystalline silicon, or a metal silicide material.

The second openings OP2 may provide a transfer path of a material for formation of the gate electrodes 130 together with the first openings OP1. Even when a separation distance of the first openings OP1 in the y-direction is relatively large, filling of the gate electrodes 130 may be effectively performed due to the presence of the second openings OP2. After the gate electrodes 130 are formed, a material forming the gate electrodes 130 deposited in the first opening OP1 and the second opening OP2 may be removed through an additional process.

Next, the insulating layer 107 may be formed in the first opening OP1 and the second opening OP2. The insulating layer 107 may be provided in the form of a spacer in the first opening OP1 and the second opening OP2. In other words, after an insulating material is deposited, an insulating material formed on the substrate 101 is removed from a lower portion of the first opening OP1 and the second opening OP2, so the insulating layer 107 may be formed.

Next, as illustrated in FIGS. 4C and 4D, a conductive material is deposited on the insulating layer 107, so the conductive layer 110 may be formed. Thus, the first isolation region MS1 and the second isolation region MS2 may be formed thereby.

Figure 18A:
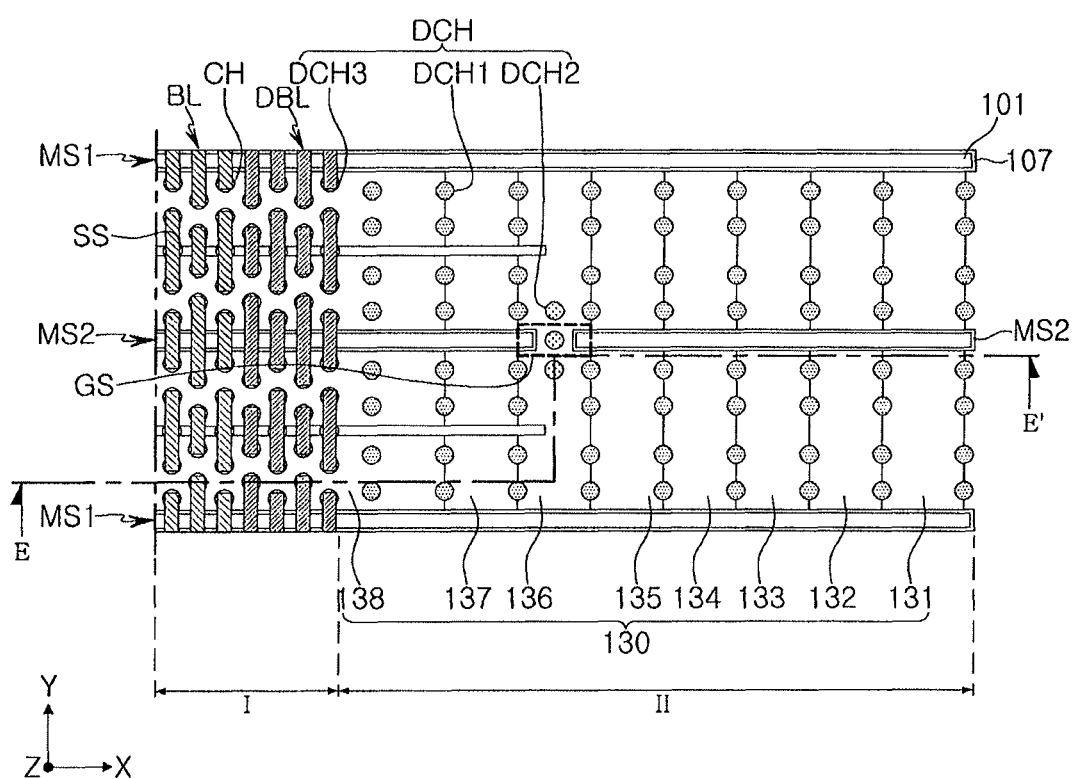
Figure 18B:
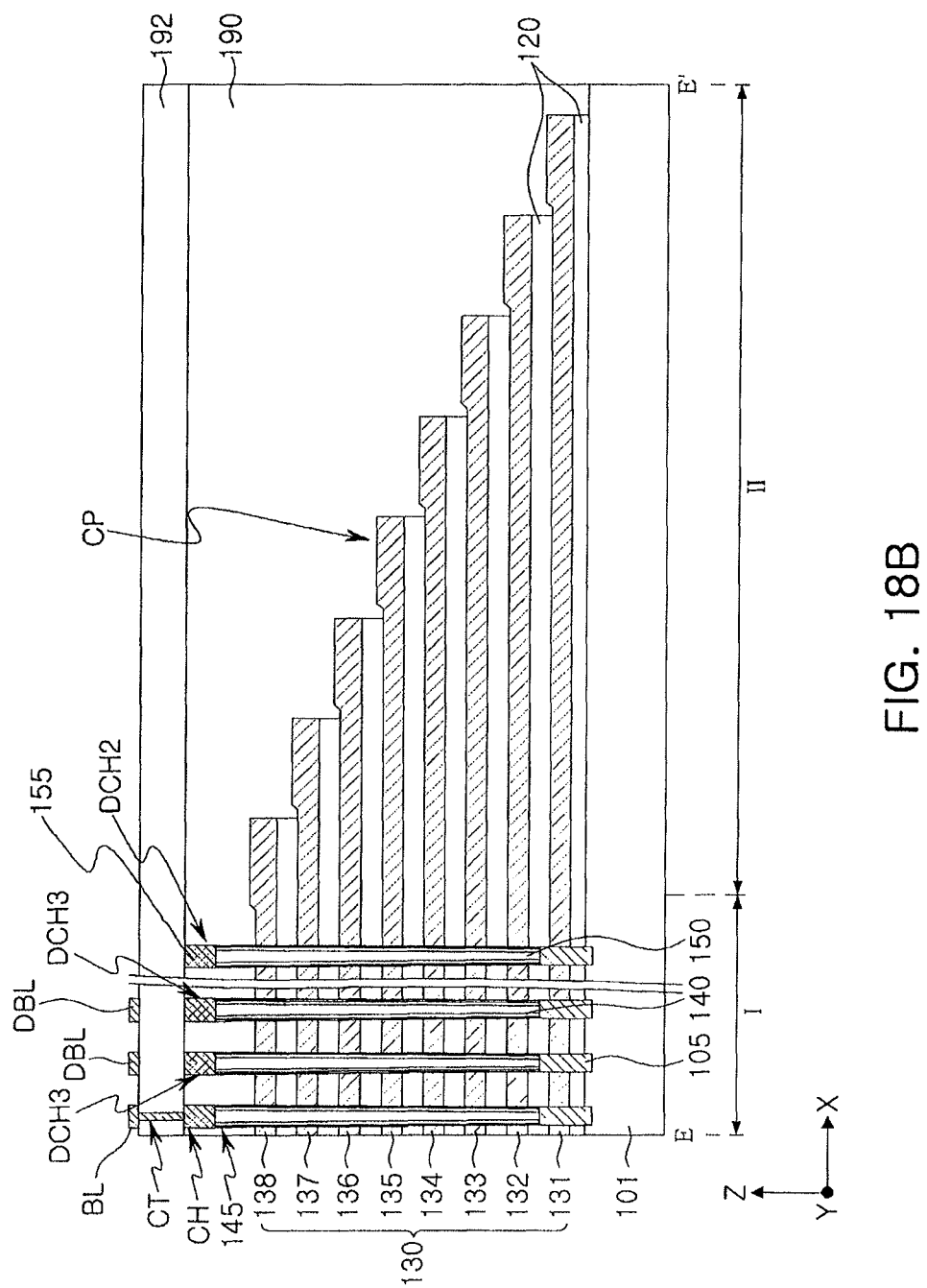

Referring to FIGS. 18A and 18B, a wiring insulation layer 192 is formed on the peripheral region insulating layer 190, and channel plugs CT passing through the wiring insulation layer 192 to be connected to the channel pad 155, and bit lines BL and dummy bit lines DBL may be formed.

The channel plugs CT may be formed above the channels CH, and may be not formed above the dummy channels DCH. The channels CH may be connected to bit lines BL in an upper portion through the channel plugs CT. The dummy channels DCH may not be connected to dummy bit lines DBL in an upper portion. Alternatively, in example embodiments, the dummy channels DCH may be connected to dummy bit lines DBL in an upper portion by separate plugs, and the dummy bit lines DBL may be in a floating state.

The bit lines BL and the dummy bit lines DBL, as illustrated in FIG. 18A, may be disposed to allow two channels CH and two first dummy channels DHC1, adjacent in the y-direction, to be connected to each other. In detail, channels CH disposed between a single first isolation region MS1 and an upper isolation region SS may be connected to different bit lines BL, respectively. However, the arrangement of the bit lines BL and the dummy bit lines DBL is not limited to those illustrated, and may be variously changed. The channel plugs CT and the bit lines BL may be formed of a conductive material.

Figure 19:
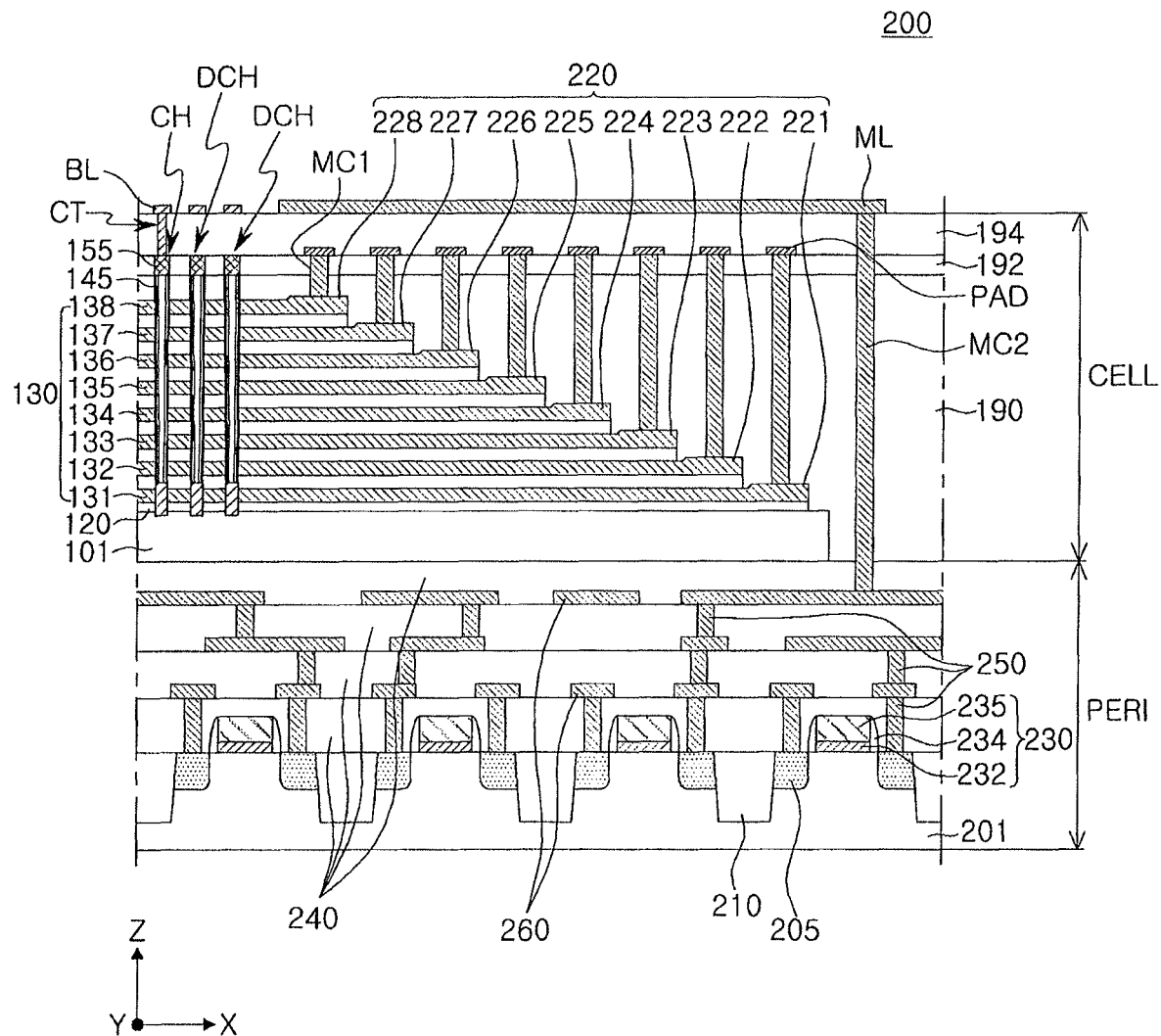
FIG. 19 illustrates a schematic cross-sectional view of a semiconductor device according to example embodiments.

FIG. 19 is a schematic cross-sectional view of a semiconductor device according to example embodiments.

Referring to FIG. 19, a semiconductor device 200 may include a memory cell region CELL and a peripheral circuit region PERI. The memory cell region CELL may be disposed in an upper end of the peripheral circuit region PERI. In example embodiments, the memory cell region CELL may be disposed at a lower end of the peripheral circuit region PERI.

The memory cell region CELL, as illustrated previously with reference to FIGS. 3 through 4D, may include a substrate 101, gate electrodes 130 stacked on the substrate 101, and channels CH and dummy channels DCH, disposed to pass through the gate electrodes 130. The memory cell region CELL may further include a peripheral region insulating layer 190 and wiring insulation layers 192 and 194, and may further include channel plugs CT and bit lines BL connected to channel pads 155, pads PAD connected to first contact plugs MC1, and a metal line ML. The memory cell region CELL may have a structure according to various example embodiments as described previously with reference to FIGS. 3 through 12.

The peripheral circuit region PERI may include a base substrate 201, circuit elements 230 disposed on the base substrate 201, circuit contact plugs 250, and wiring lines 260.

The base substrate 201 may have an upper surface extended in the x-direction and in the y-direction. In the base substrate 201, element isolation layers 210 are formed therein, so an active region may be defined. Source/drain regions 205 including impurities may be disposed in a portion of the active region. The base substrate 201 may include a semiconductor material, e.g., a Group IV semiconductor, a Group III-V compound semiconductor, or a Group II-VI oxide semiconductor.

The circuit elements 230 may include a horizontal transistor. Each of the circuit elements 230 may include a circuit gate insulating layer 232, a spacer layer 234, and a circuit gate electrode 235. The source/drain regions 205 may be disposed in the base substrate 201 on both sides of the circuit gate electrode 235.

A plurality of peripheral region insulating layers 240 may be disposed in a circuit element 230 above the base substrate 201. The circuit contact plugs 250 may pass through the peripheral region insulating layers 240 to be connected to the source/drain regions 205. An electrical signal may be applied to the circuit element 230 by the circuit contact plugs 250. In a region not illustrated, the circuit contact plugs 250 may also be connected to the circuit gate electrode 235. The wiring lines 260 may be connected to the circuit contact plugs 250, and may be disposed as a plurality of layers. The gate electrodes 130 of the memory cell region CELL may be connected to the circuit elements 230 of the peripheral circuit region PERI through the metal line ML and the second contact plug MC2.

In the semiconductor device 200, after the peripheral circuit region PERI is manufactured first, the substrate 101 of the memory cell region CELL is formed in an upper portion thereof, so the memory cell region CELL may be manufactured. The substrate 101 may have the same size as the base substrate 201, or may be formed to be smaller than the base substrate 201.

Figure 20:
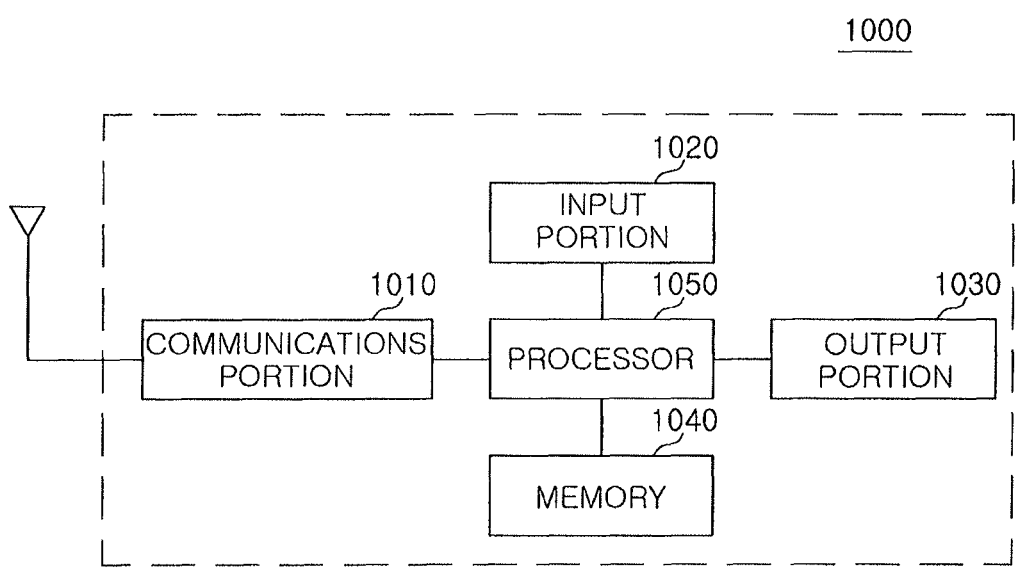
FIG. 20 illustrates a block diagram of an electronic device including a semiconductor device according to example embodiments.

FIG. 20 is a block diagram illustrating an electronic device including a semiconductor device according to example embodiments.

Referring to FIG. 20, an electronic device 1000 according to an example embodiment may include a communications portion 1010, an input portion 1020, an output portion 1030, a memory 1040, and a processor 1050.

The communications portion 1010 may include a wired/wireless communications module, and may include a wireless Internet module, a local communications module, a GPS module, a mobile communications module, and the like. The wired/wireless communications module included in the communications portion 1010 is connected to an external communications network by various communications standard specifications to transmit and receive data. The input portion 1020 is a module provided to allow an operation of the electronic device 1000 to be controlled by a user, may include a mechanical switch, a touch screen, a voice recognition module, and the like, and may further include various sensor modules through which a user can input data. The output portion 1030 may output information processed in the electronic device 1000 in the form of audio or image data, and the memory 1040 may store a program for processing and controlling the processor 1050, data, or the like. The memory 1040 may include one or more semiconductor devices according to various example embodiments as described previously with reference to FIGS. 3 through 19, and may communicate with the processor 1050 either embedded in the electronic device 1000 or via a separate interface. The processor 1050 may control an operation of each portion included in the electronic device 1000. The processor 1050 may perform controlling and processing related to voice communication, video communication, data communication, and the like, or may perform controlling and processing for multimedia playback and management. The processor 1050 may process input received from a user through the input portion 1020 and may output the result through the output portion 1030, and may store data, necessary for controlling an operation of the electronic device 1000, in the memory 1040 or may retrieve the data from the memory 1040.

By way of summation and review, according to example embodiments, dummy channels are disposed in a periphery of a gate connection portion, so a semiconductor device having improved reliability may be provided. That is, dummy channels are disposed in an interior of or along, e.g., directly adjacent to, a side surface of the gate connection portion, e.g., an H-cut structure, to prevent collapsing of the gate connection portion during manufacturing.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate having a first region and a second region;
gate electrodes stacked perpendicularly to an upper surface of the substrate in the first region, the gate electrodes extending to different lengths in a first direction in the second region, and each of the gate electrodes including:
subgate electrodes spaced apart from each other in a second direction perpendicular to the first direction, and
gate connection portions connecting subgate electrodes of a same gate electrode of the gate electrodes to each other;
channels extending through the gate electrodes perpendicularly to the upper surface of the substrate in the first region; and
dummy channels extending through the gate electrodes perpendicularly to the upper surface of the substrate, the dummy channels including:
first dummy channels arranged in the second region in rows and columns, the rows extending in the first direction, and the columns extending in the second direction,
second dummy channels arranged in the second region on both sides of at least a portion of the gate connection portions in the second direction, the second dummy channels being arranged between two columns of the first dummy channels that are adjacent to each other along the first direction, and
third dummy channels arranged in the first region adjacent to the second region.

2. The semiconductor device as claimed in claim 1, further comprising a lower isolation region passing only through some of the gate electrodes, the lower isolation region passing through at least a lowermost gate electrode of the gate electrodes in a lowermost portion among the gate electrodes, the gate connection portions overlapping the lower isolation region, in a plan-view, and the second dummy channels being arranged on both sides of the lower isolation region in the second direction.

3. The semiconductor device as claimed in claim 1, further comprising:
a wiring insulation layer on the channels and the dummy channels;
channel plugs passing through the wiring insulation layer to be connected to the channels; and
wiring lines electrically connected to the channels through the channel plugs,
wherein upper surfaces of the dummy channels are entirely covered with the wiring insulation layer, such that the dummy channels are not electrically connected to the wiring lines.

4. The semiconductor device as claimed in claim 3, wherein each of the wiring lines connects two adjacent channels of the channels along the second direction.

5. The semiconductor device as claimed in claim 1, wherein the dummy channels further include third dummy channels passing through at least a portion of the gate connection portions in the second region, the third dummy channels being arranged between the two columns of the first dummy channels that are adjacent to each other along the first direction.

6. The semiconductor device as claimed in claim 5, wherein the third dummy channels are arranged in a line with the second dummy channels along the second direction.

7. The semiconductor device as claimed in claim 1, wherein:
the gate electrodes include contact regions at edges thereof, respectively, a lower gate electrode of the gate electrodes extending farther in the first direction than an upper gate electrode of the gate electrodes,
the first dummy channels are at a boundary of the contact regions, and
the second dummy channels are in the contact regions.

8. The semiconductor device as claimed in claim 1, further comprising upper isolation regions extending in the first direction, and passing only through some of the gate electrodes, the upper isolation regions passing through at least one gate electrode including a gate electrode in an uppermost portion among the gate electrodes.

9. The semiconductor device as claimed in claim 1, wherein the first region is a memory cell region including a plurality of memory cells along the channels, and the second region is electrically connecting the memory cell region and a control logic region driving the plurality of memory cells.

10. The semiconductor device as claimed in claim 1, wherein the gate connection portions are integrally formed with and include a same material as the subgate electrodes.

11. A semiconductor device, comprising:
   gate electrodes stacked in a direction perpendicular to an upper surface of a substrate, each of the gate electrodes including:
      subgate electrodes spaced apart from each other, and
      gate connection portions connecting subgate electrodes of a same gate electrode of the gate electrodes to each other;
   isolation regions extending in a first direction and passing through the gate electrodes, the isolation regions being spaced apart from each other in the first direction, and the gate connection portions being between adjacent ones of the isolation regions;
   channels extending through the gate electrodes perpendicularly to the upper surface of the substrate;
   dummy channels extending perpendicularly to the upper surface of the substrate, the dummy channels arranged on at least one side of at least a portion of the gate connections portions in a second direction;
   a wiring insulation layer on the channels and the dummy channels;
   wiring lines on the wiring insulation layer, the wiring lines overlapping the channels and at least some of the dummy channels along a vertical direction; and
   channel plugs passing through the wiring insulation layer and connecting the channels and at least some of the wiring lines,
   wherein upper surfaces of the dummy channels are entirely covered with the wiring insulation layer, such that the dummy channels are not electrically connected to the wiring lines.

12. The semiconductor device as claimed in claim 10, further comprising a lower isolation region passing through at least one gate electrode including a gate electrode in a lowermost portion among the gate electrodes, the gate connection portions overlapping the lower isolation region, in a plan-view, the dummy channels being arranged on at least one side of the lower isolation region in the second direction.

13. A semiconductor device, comprising:
   a substrate having a first region and a second region;
   gate electrodes stacked perpendicularly to an upper surface of the substrate in the first region, and extending to different lengths in a first direction in the second region;
   first isolation regions extended in the first direction while passing through the gate electrodes in the first region and the second region, the first isolation regions being spaced apart from each other in a second direction perpendicular to the first direction;
   second isolation regions passing through the gate electrodes between the first isolation regions, the second isolation regions being spaced apart from each other in the first direction;
   channels extending perpendicularly to the upper surface of the substrate through the gate electrodes in the first region;
   dummy channels extending perpendicularly to the upper surface of the substrate through the gate electrodes in the second region, the dummy channels including first dummy channels arranged in rows and columns and second dummy channels on both sides of a separation region in the second direction, the separation region being a region in which adjacent ones of the second isolation regions are spaced apart from each other in the first direction;
   upper isolation regions extending in the first direction, and passing through at least one gate electrode including a gate electrode in an uppermost portion among the gate electrodes, between the second isolation regions and the first isolation regions; and
   a lower isolation region passing only through some of the gate electrodes, the lower isolation region passing at least through one gate electrode including a gate electrode in a lowermost portion among the gate electrodes, in a region vertically overlapping the separation region.

14. The semiconductor device as claimed in claim 13, wherein the second dummy channels are arranged on both sides of the lower isolation region in the second direction.

15. The semiconductor device as claimed in claim 13, wherein the dummy channels further include third dummy channels in the separation region.

16. The semiconductor device as claimed in claim 15, wherein the third dummy channels are arranged in a line with the second dummy channels along the second direction.

17. The semiconductor device as claimed in claim 13, wherein the dummy channels are arranged outside the separation region such that the dummy channels are not disposed within the separation region.

18. The semiconductor device as claimed in claim 13, wherein the second dummy channels are shifted from the columns of the first dummy channels extending in the second direction.

19. The semiconductor device as claimed in claim 13, wherein the second dummy channels are between the rows of the first dummy channels extending in the first direction.

* * * * *